US011991856B2

(12) United States Patent
Tufty et al.

(10) Patent No.: US 11,991,856 B2
(45) Date of Patent: *May 21, 2024

(54) LIQUID SUBMERSION COOLED ELECTRONIC SYSTEMS

(71) Applicant: LiquidCool Solutions, Inc., Rochester, MN (US)

(72) Inventors: Rick Tufty, Rochester, MN (US); Steve Shafer, Rochester, MN (US)

(73) Assignee: LiquidCool Solutions, Inc., Rochester, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/314,666

(22) Filed: May 7, 2021

(65) Prior Publication Data

US 2021/0368650 A1 Nov. 25, 2021

Related U.S. Application Data

(63) Continuation of application No. 16/222,429, filed on Dec. 17, 2018, now Pat. No. 11,032,939, which is a
(Continued)

(51) Int. Cl.
*H05K 7/20* (2006.01)
*G06F 1/20* (2006.01)
*H05K 5/06* (2006.01)

(52) U.S. Cl.
CPC ........... *H05K 7/20236* (2013.01); *G06F 1/20* (2013.01); *H05K 5/067* (2013.01);
(Continued)

(58) Field of Classification Search
CPC ............. H05K 7/20236; H05K 5/0008; H05K 7/20772; H05K 7/20409; H05K 7/20436;
(Continued)

(56) References Cited

U.S. PATENT DOCUMENTS

| 4,656,559 A | | 4/1987 | Fathi | |
|---|---|---|---|---|
| 5,907,473 A | * | 5/1999 | Przilas | ............... H05K 7/20345 174/15.1 |

(Continued)

FOREIGN PATENT DOCUMENTS

| CN | 101443724 | 5/2009 |
|---|---|---|
| CN | 102342191 | 2/2012 |

(Continued)

OTHER PUBLICATIONS

International Search Report for International Application No. PCT/US2015/052149, dated Jan. 13, 2016 (3 pages).
(Continued)

*Primary Examiner* — Mandeep S Buttar
(74) *Attorney, Agent, or Firm* — HSML P.C.

(57) ABSTRACT

An enclosure for an electronic system that is configured to act as a heat exchanger to remove heat from a cooling liquid that is circulated through the electronic system for cooling the electronic components thereof which are submerged in the cooling liquid in direct contact therewith. The enclosure uses an arrangement of a combination of external fins on one or more walls and fluid passages formed in one or more of the walls through which the cooling liquid is circulated for cooling. The fluid passages and the external fins are preferably formed on the same wall. The fins and the fluid passages can be formed on any number of walls of the enclosure.

5 Claims, 18 Drawing Sheets

Related U.S. Application Data continuation-in-part of application No. 14/867,541, filed on Sep. 28, 2015, now Pat. No. 10,271,456.

(60) Provisional application No. 62/056,150, filed on Sep. 26, 2014.

(52) U.S. Cl.
CPC ..... H05K 7/20263 (2013.01); H05K 7/20272 (2013.01); H05K 7/20281 (2013.01); H05K 7/20772 (2013.01); *G06F 2200/201* (2013.01)

(58) Field of Classification Search
CPC ............... H05K 7/20781; H05K 7/203; H05K 7/20345; H05K 7/20763; H05K 5/06; H05K 5/067; H05K 7/20936; H05K 7/20872; G06F 1/20; G06F 2200/201; G06F 1/181; G06F 1/206; H01M 10/6551; H01L 23/473; H01L 23/44; H01L 23/4735; F28F 3/12; F28F 2250/08; F28D 1/02; F28D 2021/0031; F28D 1/0206; F28D 15/00; F28D 15/0266
USPC ..... 361/699, 679.53, 679.54, 698, 704, 689, 361/696, 697, 701, 703, 676, 677, 679.49, 361/709; 165/104.33, 80.4, 104.21, 80.5, 165/80.2, 908; 257/706, 715, 23.095, 257/23.103; 62/259.2, 64
See application file for complete search history.

(56) References Cited

U.S. PATENT DOCUMENTS

| | | | |
|---|---|---|---|
| 6,144,556 A | 11/2000 | Lanclos | |
| 6,955,062 B2* | 10/2005 | Tilton | H05K 7/20345 |
| | | | 361/699 |
| 7,403,392 B2 | 7/2008 | Attlesey et al. | |
| 7,905,106 B2 | 3/2011 | Attlesey | |
| 8,089,765 B2 | 1/2012 | Attlesey | |
| 8,157,269 B2 | 4/2012 | Rueger et al. | |
| 2004/0250992 A1 | 12/2004 | Aoki | |
| 2005/0157468 A1* | 7/2005 | Chen | G06F 1/20 |
| | | | 257/E23.098 |
| 2006/0131818 A1 | 6/2006 | Diez et al. | |
| 2007/0023169 A1* | 2/2007 | Mahalingam | F25D 17/02 |
| | | | 165/104.28 |
| 2007/0025081 A1 | 2/2007 | Berlin et al. | |
| 2007/0034359 A1 | 2/2007 | Liu et al. | |
| 2007/0267741 A1 | 11/2007 | Attlesey et al. | |
| 2008/0007913 A1* | 1/2008 | Sullivan | H05K 7/20636 |
| | | | 361/699 |
| 2009/0260777 A1* | 10/2009 | Attlesey | H01L 23/473 |
| | | | 165/104.33 |
| 2010/0039771 A1* | 2/2010 | Marchand | H05K 7/20909 |
| | | | 361/694 |
| 2010/0103618 A1* | 4/2010 | Campbell | H05K 7/20772 |
| | | | 361/699 |
| 2010/0226094 A1* | 9/2010 | Attlesey | H05K 7/20772 |
| | | | 361/699 |
| 2011/0267768 A1* | 11/2011 | Attlesey | H05K 7/20772 |
| | | | 361/679.02 |
| 2011/0292595 A1* | 12/2011 | El-Essawy | G06F 1/20 |
| | | | 361/679.53 |
| 2012/0044633 A1 | 2/2012 | Attlesey | |
| 2013/0180687 A1 | 7/2013 | Campbell et al. | |
| 2013/0299232 A1 | 11/2013 | Fitz-Patrick et al. | |
| 2014/0218859 A1* | 8/2014 | Shelnutt | H05K 7/20809 |
| | | | 361/679.46 |
| 2014/0307384 A1* | 10/2014 | Best | H05K 7/1497 |
| | | | 361/679.53 |
| 2015/0195953 A1 | 7/2015 | Best et al. | |
| 2020/0390007 A1* | 12/2020 | Edmunds | H05K 7/20272 |

FOREIGN PATENT DOCUMENTS

| | | |
|---|---|---|
| DE | 202004003644 | 5/2004 |
| EP | 2003-218571 | 7/2003 |
| EP | 1 881 394 | 1/2008 |
| GB | 2571053 | 8/2019 |
| JP | 3103678 U | 8/2004 |
| JP | 2004-247574 | 9/2004 |
| WO | 2018/096362 | 5/2018 |

OTHER PUBLICATIONS

Written Opinion for International Application No. PCT/US2015/052149, dated Jan. 13, 2016 (6 pages).

European Search Report issued in European Application No. 15844712.8 dated May 29, 2018 (7 pages).

"Freeing HPC From the Datacentre—KU:L Sistem", obtained from http://www.iceotope.com/rackservers/; date is unknown—in Applicant's possession about Aug. 5, 2018; 9 pages.

Office Action issued in corresponding Japanese Application No. 2017-516278, dated May 9, 2019, 6 pages with translation.

Office Action issued in corresponding Chinese Patent Application No. 2019104191551, dated May 7, 2020, 11 pages with translation.

* cited by examiner

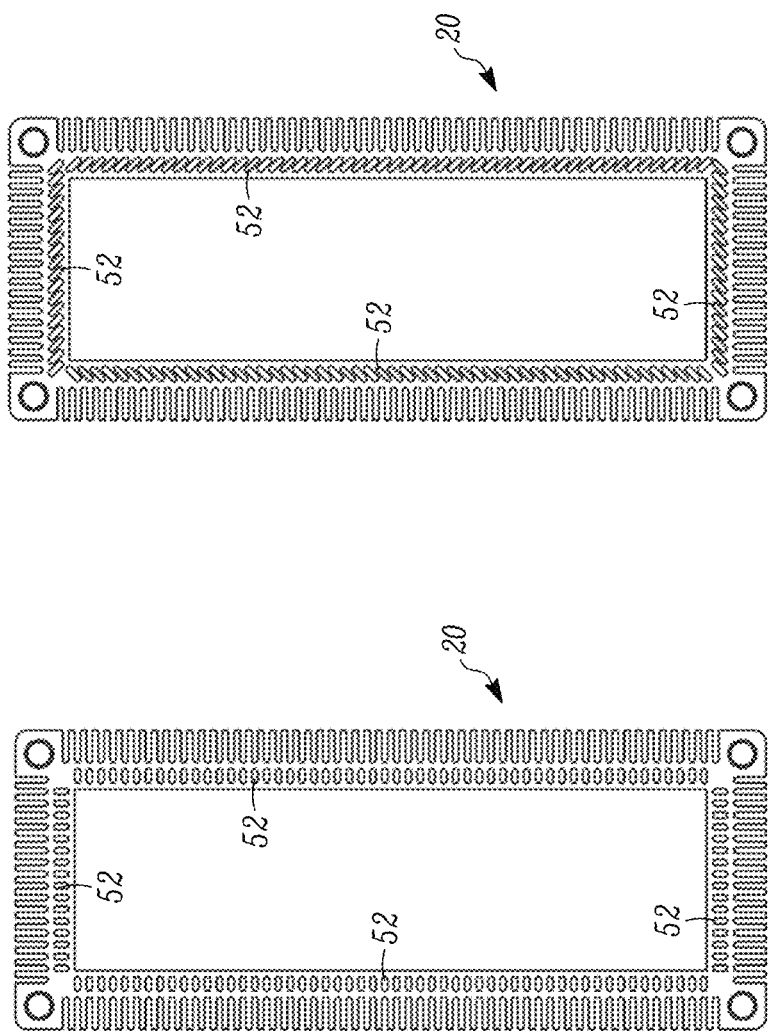

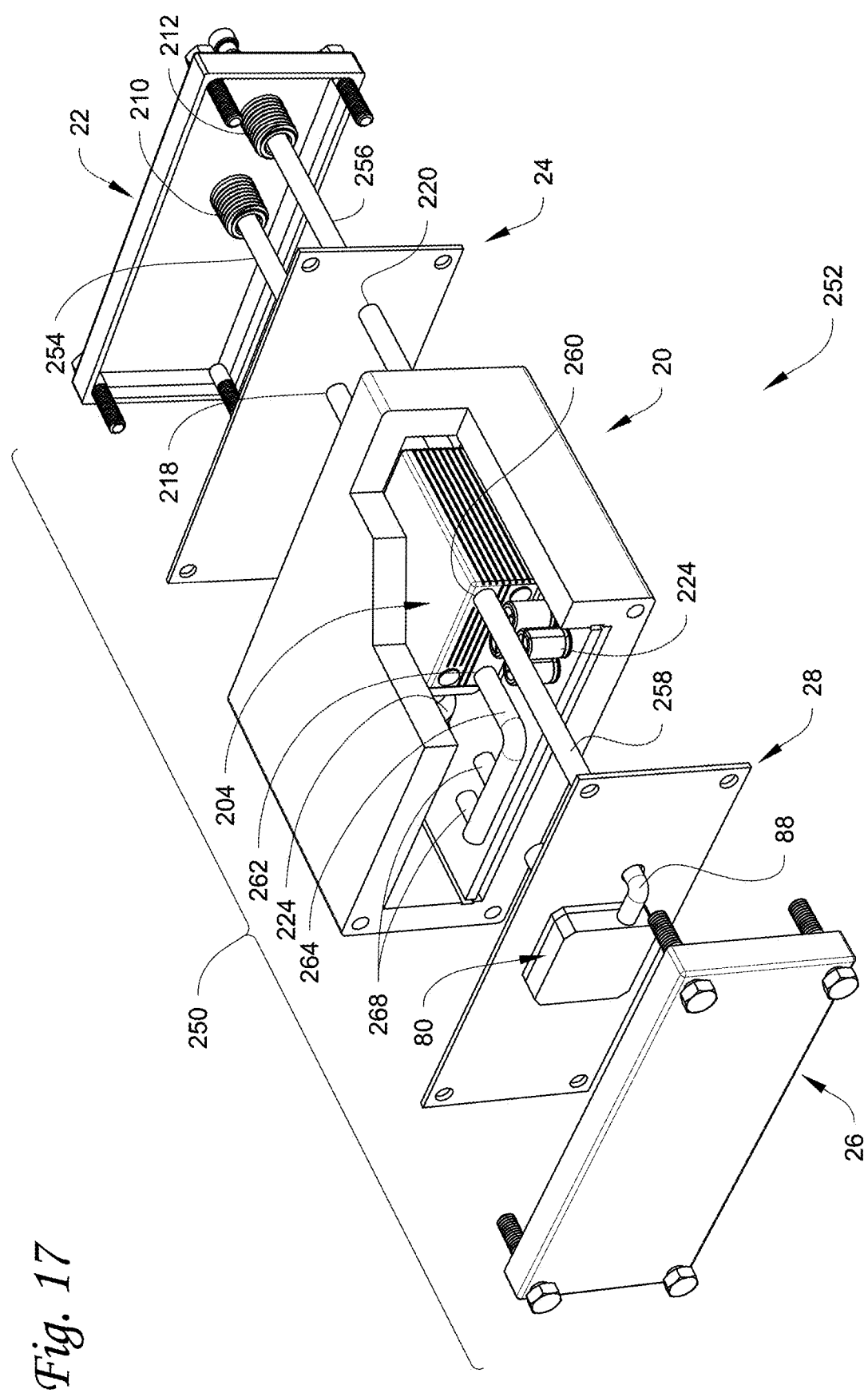

LIQUID SUBMERSION COOLED ELECTRONIC SYSTEMS

FIELD

This disclosure relates to liquid submersion cooling of electronic systems where electronic components are disposed within an enclosure and submerged within a liquid coolant that cools the electronic components.

BACKGROUND

Liquid submersion of electronics to cool the electronics through direct contact with a liquid coolant is known. Examples of liquid submersion cooling of electronics are disclosed in U.S. Pat. Nos. 7,905,106 and 7,403,392 among others. Liquid submersion cooling of electronics has a number of advantages over air cooling of electronics including increased energy efficiency by eliminating the need for fans and reducing HVAC cooling; quieter operation by eliminating fan noise; use in harsh environments since the electronics are contained in a sealed, liquid-tight enclosure that protects the electronics from humidity, salt, sand, dust and other contaminants; and high reliability by reducing or preventing thermal fatigue, corrosion and contamination of the electronics.

SUMMARY

An enclosure and an electronic system that uses the enclosure are described. The enclosure provides improved heat removal from a cooling liquid that is circulated through the electronic system for cooling the electronic components thereof which are submerged in the cooling liquid in direct contact therewith.

The enclosure is configured to house the electronic components, as well as act as a heat exchanger through which the cooling liquid is circulated to cool the cooling liquid. Since the enclosure is configured to act as a heat exchanger, it is not necessary to circulate the cooling liquid to an external heat exchanger for cooling of the liquid. However, in some embodiments, in addition to the cooling provided by the enclosure, the cooling liquid can be circulated to an external heat exchanger for additional cooling.

The enclosure uses an arrangement of a combination of external fins on one or more walls and fluid passages formed in one or more of the walls through which the cooling liquid is circulated for cooling. The fluid passages and the external fins are preferably formed on the same wall. The fins and fluid passages can be formed on any number of walls of the enclosure.

In one embodiment, the enclosure is formed by a primary housing that forms the majority of the enclosure and that is open at opposite ends, and end plates that close the open ends. One or more walls of the primary housing can be provided with the external fins and the fluid passages. In addition, external fins can be provided on one or more edges of the end plates. In one embodiment, the external fins on the end plates can align with the external fins on the wall(s) of the primary housing.

The primary housing and the end plates form a liquid-tight enclosure for holding the cooling liquid and that houses the electronics that are to be liquid submersion cooled. The electronics can be any electronics forming any electronic system that would benefit from being liquid submersion cooled. In one embodiment, the electronic system is a system that is used in a harsh environment and that has challenging thermal dissipation needs.

In one embodiment, a circulation system circulates the cooling liquid in the electronic system, with the circulation system being configured to direct the cooling liquid through the fluid passages in the wall(s) of the primary housing. In one embodiment, the circulation system can include a pump that is part of the electronic system so that the cooling liquid remains within the enclosure. In another embodiment, the pump of the circulation system is external to the electronic system so that the cooling liquid is circulated outside of the enclosure for cooling before being returned back into the enclosure.

DRAWINGS

FIGS. 10A, 10B, 10C and 10D are top/bottom end views of different embodiments of primary housings of the enclosure with the electronic components removed.

FIG. 17 is an exploded rear perspective view of still another embodiment of an enclosure of an electronic system described herein.

DETAILED DESCRIPTION

Figure 1:
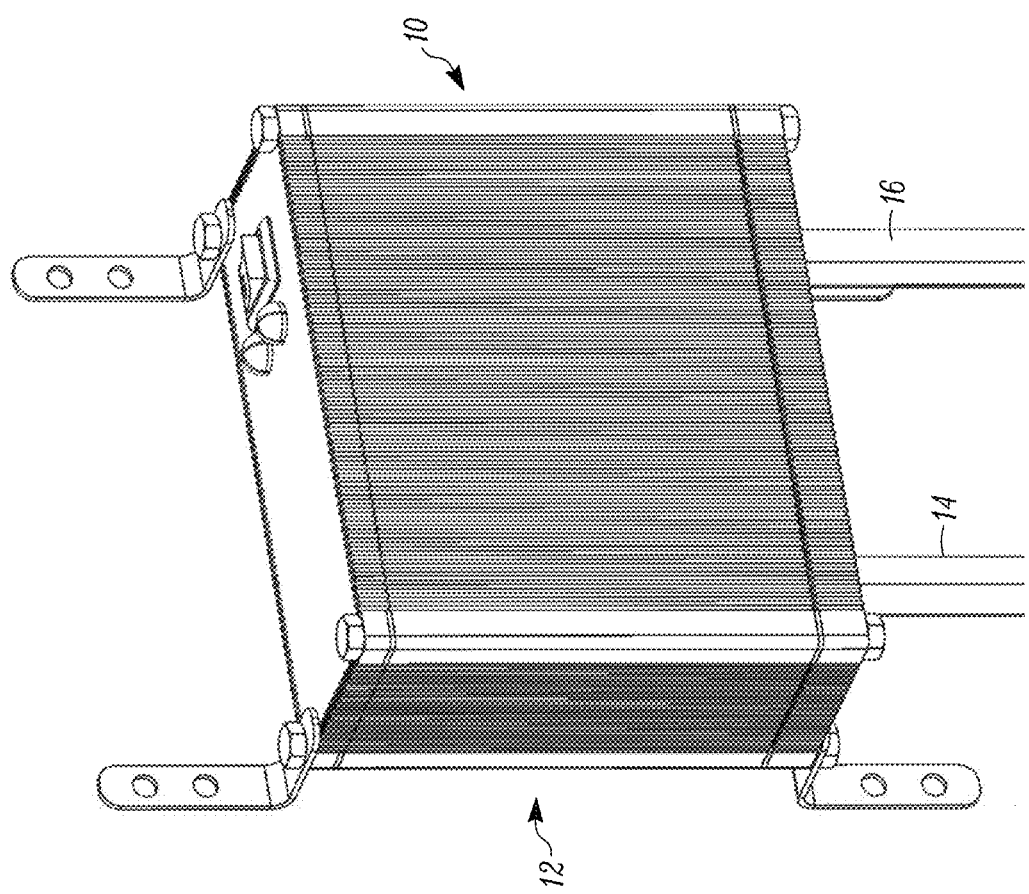
FIG. 1 is a perspective view of one embodiment of an electronic system incorporating the enclosure described herein.

With reference initially to FIG. 1, an example of an electronic system 10 incorporating an enclosure 12 described herein is illustrated. The electronic system 10 utilizes liquid submersion cooling of electronic components that are disposed within the enclosure 12. The enclosure 12 forms a liquid tight housing that houses the electronics components and the cooling liquid. The electronic components can be any electronic components forming any electronic system that would benefit from being liquid submersion cooled. In one embodiment, the electronic system 10 can be a system that is used in a harsh environment, such as in an environment where the system 10 is exposed to sand, high humidity, salt water, and other environmental challenges, and where the system 10 has challenging thermal dissipation needs.

The enclosure provides improved heat removal from a cooling liquid that is circulated through the electronic system for cooling the electronic components thereof which are submerged in the cooling liquid in direct contact therewith. Examples of liquid submersion cooling of electronics are disclosed in U.S. Pat. Nos. 7,905,106 and 7,403,392, which are incorporated herein by reference.

The cooling liquid used to submerge the electronic components can be, but is not limited to, a dielectric liquid. The cooling liquid can be single phase or two-phase. In one embodiment, the cooling liquid has a high enough thermal transfer capability to handle the amount of heat being generated by the submerged electronic components so that the cooling liquid does not change state. Enough of the cooling liquid is present in the enclosure 12 in order to submerge the heat generating components that one wishes to submerge. So in some instances the cooling liquid may fill substantially the entire enclosure 12, while in other instances the cooling liquid may only partially fill the enclosure 12.

Returning to FIG. 1, the system 10 can include one or more inputs 14 through which electrical power and/or data can be input into the enclosure 12. The system 10 can also include one or more outputs 16 through which electrical power and/or data can be output from the enclosure 12. In one embodiment, the input 14 can input electrical power and electrical power and/or data is output via the output 16. In another embodiment where electrical energy to power the system 10 is provided by one or more batteries internal to the enclosure 12, data can be input via the input 14, and electrical power and/or data is output via the output 16. Other inputs and outputs are possible depending upon the function and purpose of the system 10 and the electronic components in the enclosure 12.

With reference to FIGS. 2-6, the enclosure 12 includes a primary housing 20, an end plate 22 at one end, a sealing gasket 24 for sealing between the primary housing 20 and the end plate 22, an end plate 26 at the opposite end, and a sealing gasket 28 for sealing between the primary housing 20 and the end plate 26.

Figure 3:
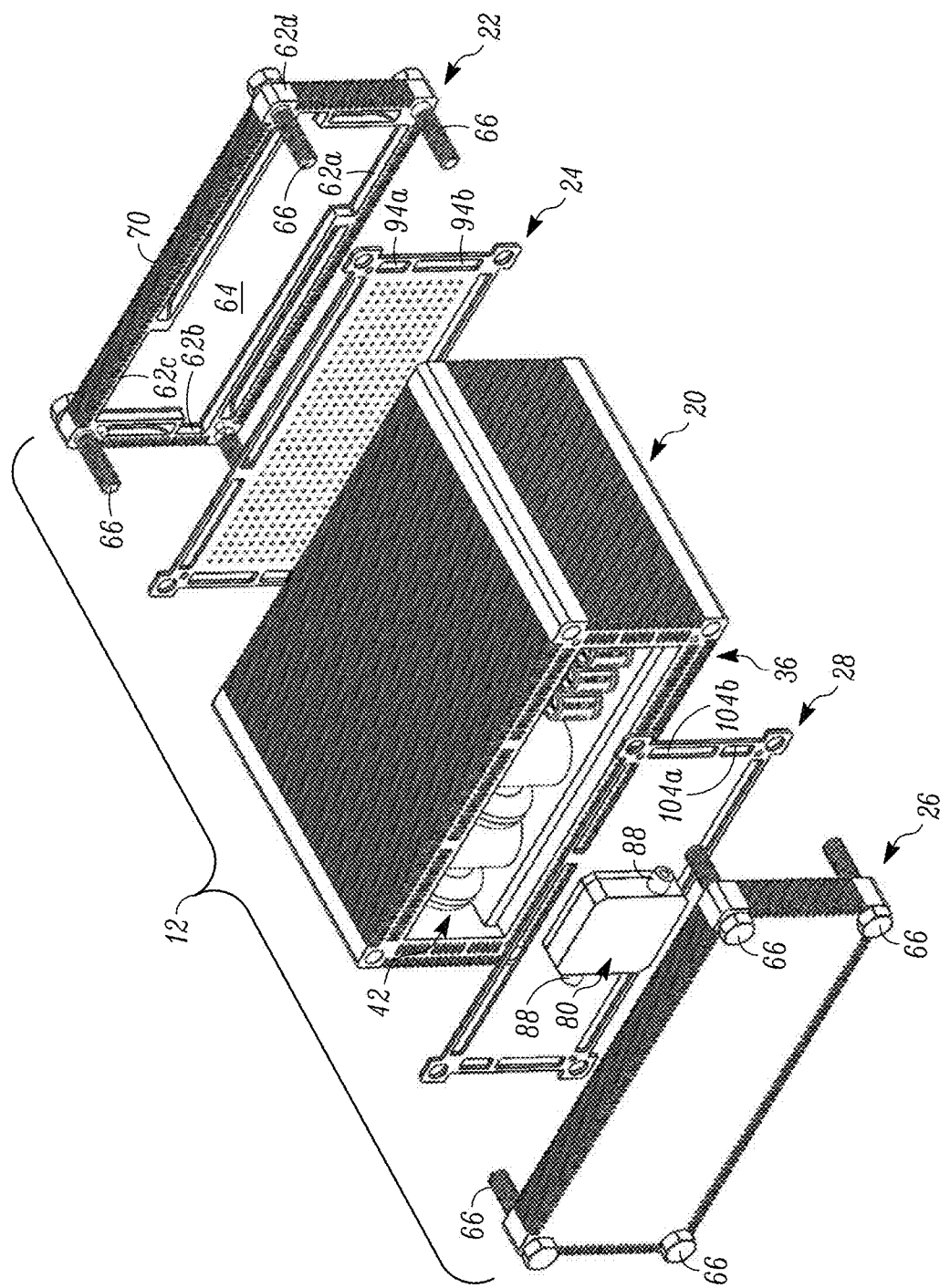
FIG. 3 is an exploded rear perspective view of the enclosure of the electronic system of FIG. 1 illustrating the components thereof.
Figure 5:
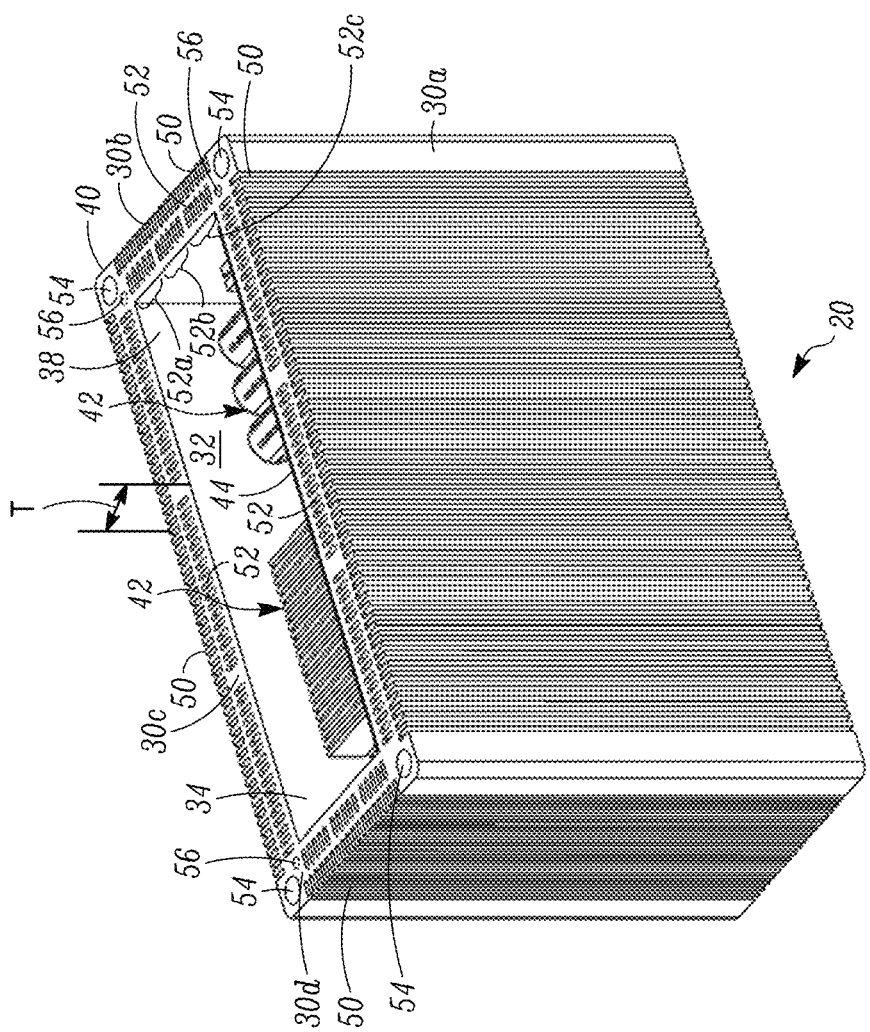
FIG. 5 is a perspective view of the primary housing of the enclosure.
Figure 10A:
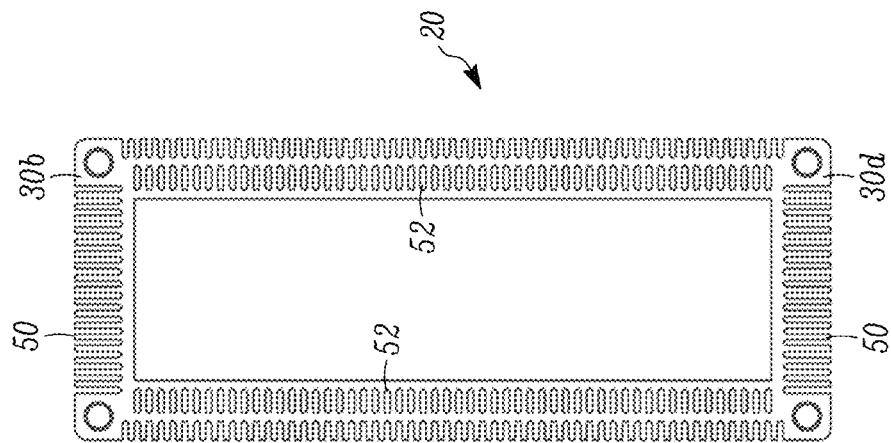

With reference primarily to FIG. 5 along with FIG. 10A, the primary housing 20 is generally rectangular in configuration and has a plurality of walls 30a, 30b, 30c, 30d defining a substantially hollow, open interior space 32, a first open end 34, and a second open end 36 (visible in FIG. 3). Each wall 30a-d has a thickness T defined between an interior surface 38 and an exterior surface 40 thereof.

A plurality of electronic components 42, at least some of which are heat generating, are disposed in the interior space 32. The type of electronic components 42 used depends upon the intended construction and function of the electronic system 10. In one embodiment, the electronic components 42 are disposed on a circuit board 44 that is supported within the interior space 32 by the walls 30b, 30d so that the circuit board 44 is adjacent and substantially parallel to the wall 30a and the electronic components are generally positioned between the circuit board 44 and the wall 30c.

In use, cooling liquid (not illustrated) partially or completely fills the interior space 32 submerging the electronic components 42 that one wishes to submersion cool using the cooling liquid.

With continued reference to FIG. 5 along with FIG. 10A, one or more of the walls 30a-d includes a combination of a plurality of heat dissipating fins 50 formed on the exterior surface 40 thereof, and a plurality of fluid passages 52 formed in the thickness T of the wall thereof between the interior surface 38 and the exterior surface 40. The fluid passages 52 are arranged generally between base ends of the fins 50 and the interior surface 38.

In use, the cooling liquid is circulated through the fluid passages 52 to cool the cooling liquid after the cooling liquid has exchanged heat with the electronic components 42. The heat from the cooling liquid is transferred through the material forming the wall(s) of the primary housing 20 to the fins 50. Heat is then dissipated from the fins 50 into the ambient air. If desired, heat dissipation from the fins 50 can be enhanced by employing one or more fans (not shown) to direct air flow over the fins 50.

The construction and arrangement of the fins 50 and the fluid passages 52, and which walls 30a-d they are provided on, can vary based on a number of factors including, but not limited to, the cooling that one wishes to achieve, the type of electronic components 42 used and the arrangement/location of the electronic components in the interior space 32.

Figure 8:
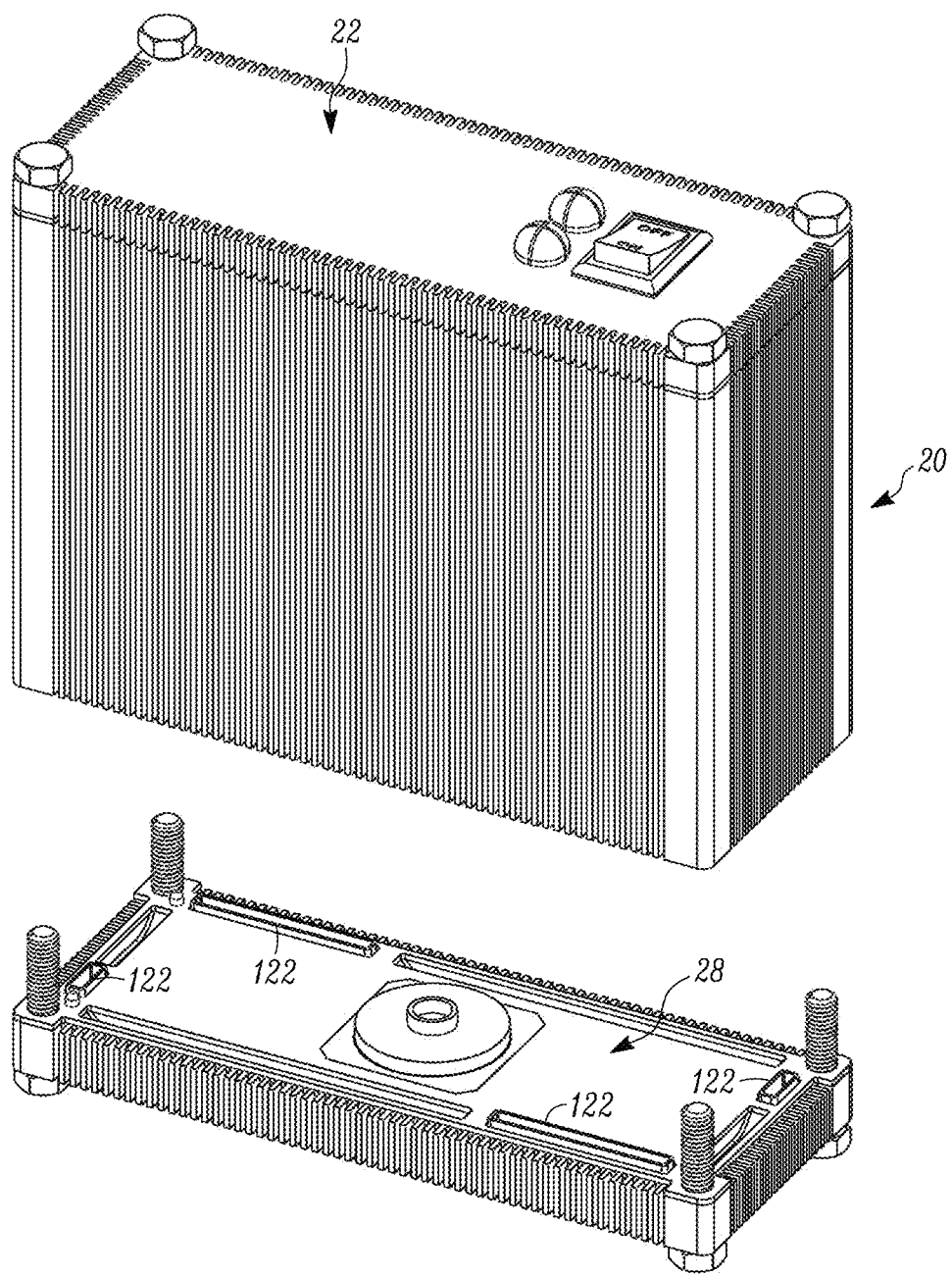
FIG. 8 is a view similar to FIG. 7 but with the sealing gasket in place.
Figure 9:
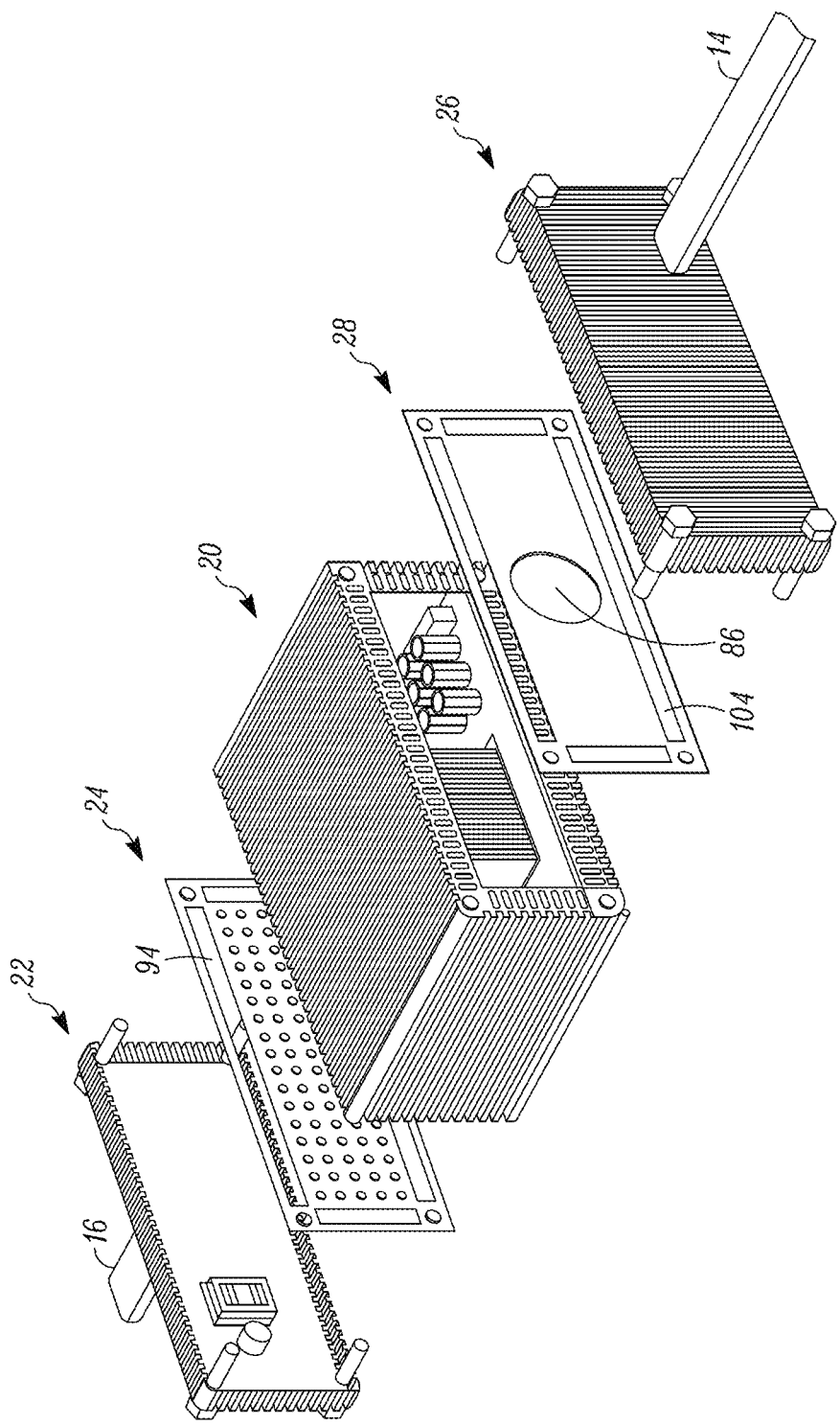
FIG. 9 is an exploded view of another embodiment of an electronic system incorporating an enclosure described herein.
Figure 10B:
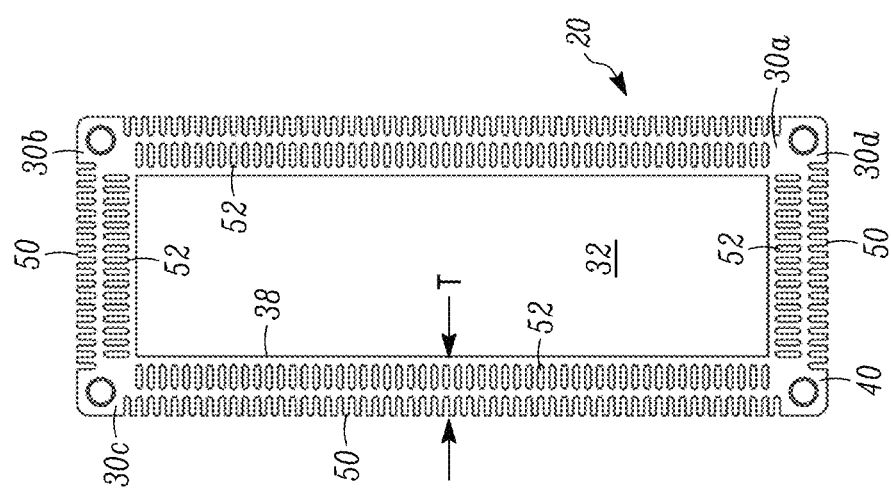

In the examples illustrated in FIGS. 1-9 and 10A, each of the walls 30a-d is provided with the fins 50 and the fluid passages 52. However, not all walls need to be provided with either or both of the fins 50 and the fluid passages 52. For example, FIG. 10B illustrates the walls 30b, 30d being formed with the fins 50 but not with the fluid passages 52. In FIG. 10B, the fins 50 on the walls 30b, 30d can be made longer than the fins 50 on the walls 30b, 30d in FIG. 10A due to the lack of the fluid passages 52 in order to provide more surface area for heat exchange.

In addition, the arrangement of the fluid passages 52 on the walls 30a-d can vary to tailor the cooling performance. For example, as shown in FIG. 5, the fluid passages 52 in one or more of the sidewalls 30a-d can be grouped together into groups or clusters 52a, 52b, 52c along one, some, or all of the walls. In FIG. 10A, the fluid passages 52 are illustrated as being evenly spaced from one another along the length of one, some, or all of the walls 30a-d. In FIG. 10B, the fluid passages 52 are illustrated as being evenly spaced along the walls 30a, 30c. In FIG. 10C, the fluid passages 52 are illustrated as being shorter in length (i.e. measured in the thickness T direction) than the fluid passages in FIGS. 5, 10A, and 10B, which permits the use of longer fins 50 for increase surface area for heat exchange, and the fluid passages are evenly spaced. In FIG. 10D, the fluid passages 52 are illustrated as being evenly spaced, but are angled relative to the thickness T direction.

In the illustrated examples, the fins 50 and the fluid passages 52 extend continuously from the open end 34 to the other open end 36. However, the fins 50 and the fluid passages 52 need not be continuous from the end 34 to the end 36. In addition, the fins 50 and the fluid passages 52 in each wall extend substantially parallel to one another and extend substantially parallel to a longitudinal axis of the primary housing 20 that extends from the open end 34 to the open end 36.

Many other variations of the fins 50 and the fluid passages 52, and which of the walls 30a-d are or are not provided with one or both, can be utilized.

The primary housing 20 can be made from any heat conducting material including plastics, metals such as aluminum, or the like. In one embodiment, the primary housing 20 is formed by extrusion so that it is a single, unitary, one-piece construction of a material such as plastic or aluminum. An example of an extruded housing for an electronic system is described in U.S. Pat. No. 8,089,765.

Returning to FIG. 5, the primary housing 20 can also be provided with fastener holes 54 at each end 34, 36 for receipt of fasteners used to secure the end plates 22, 26 to the primary housing as discussed further below. In addition, in some embodiments, locator pin holes 56 can be provided near some or all of the holes 54 at both ends 34, 36 for receipt of locator pins discussed further below.

The end plates 22, 26 can be formed from the same heat conducting material(s) as the primary housing 20, including plastics, metals such as aluminum, or the like. In one embodiment, the end plates 22, 26 may be formed by extrusion so that it is a single, unitary, one-piece construction of a material such as plastic or aluminum.

Figure 2:
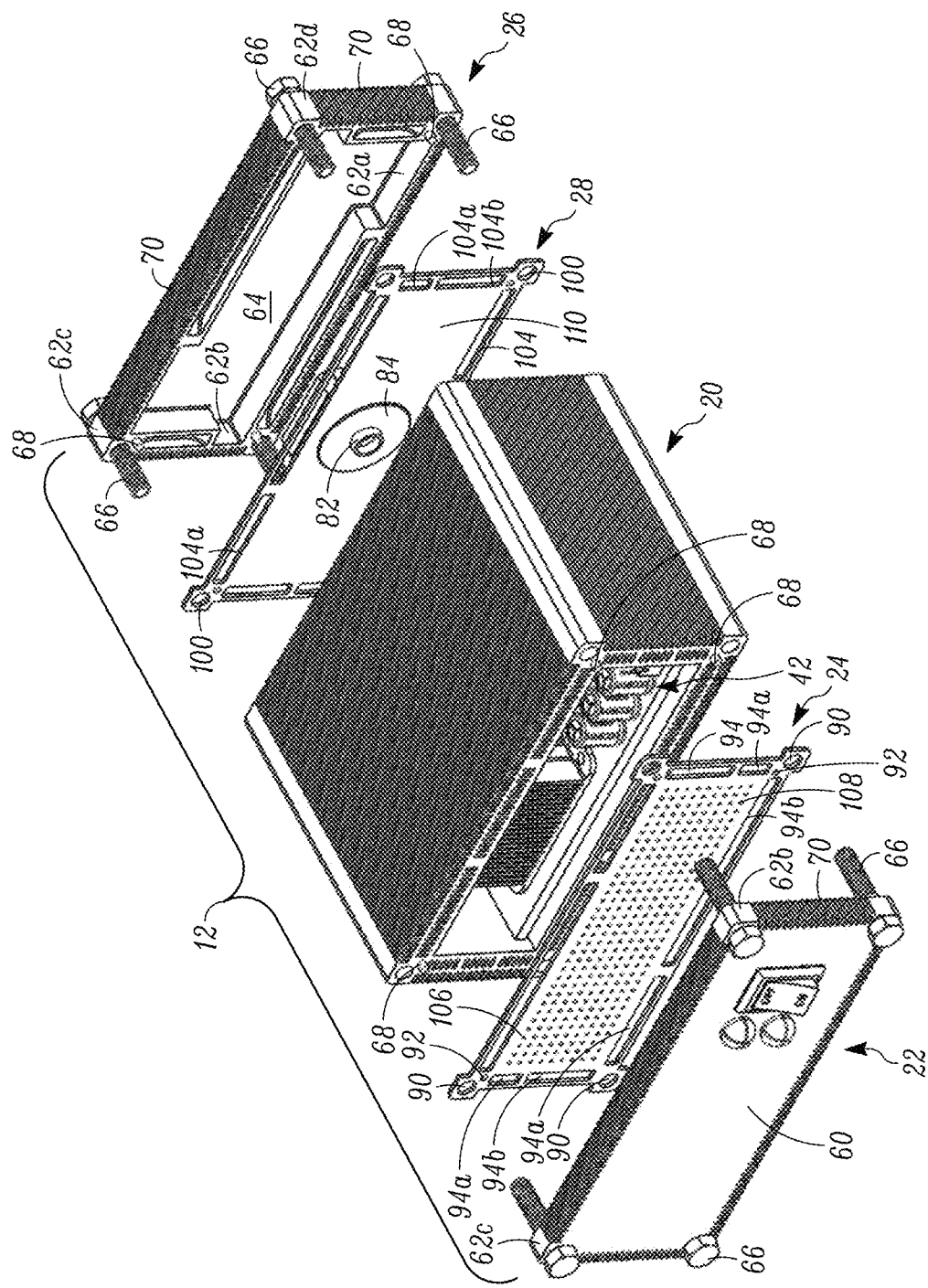
FIG. 2 is an exploded front perspective view of the enclosure of the electronic system of FIG. 1 illustrating the components thereof.
Figure 4:
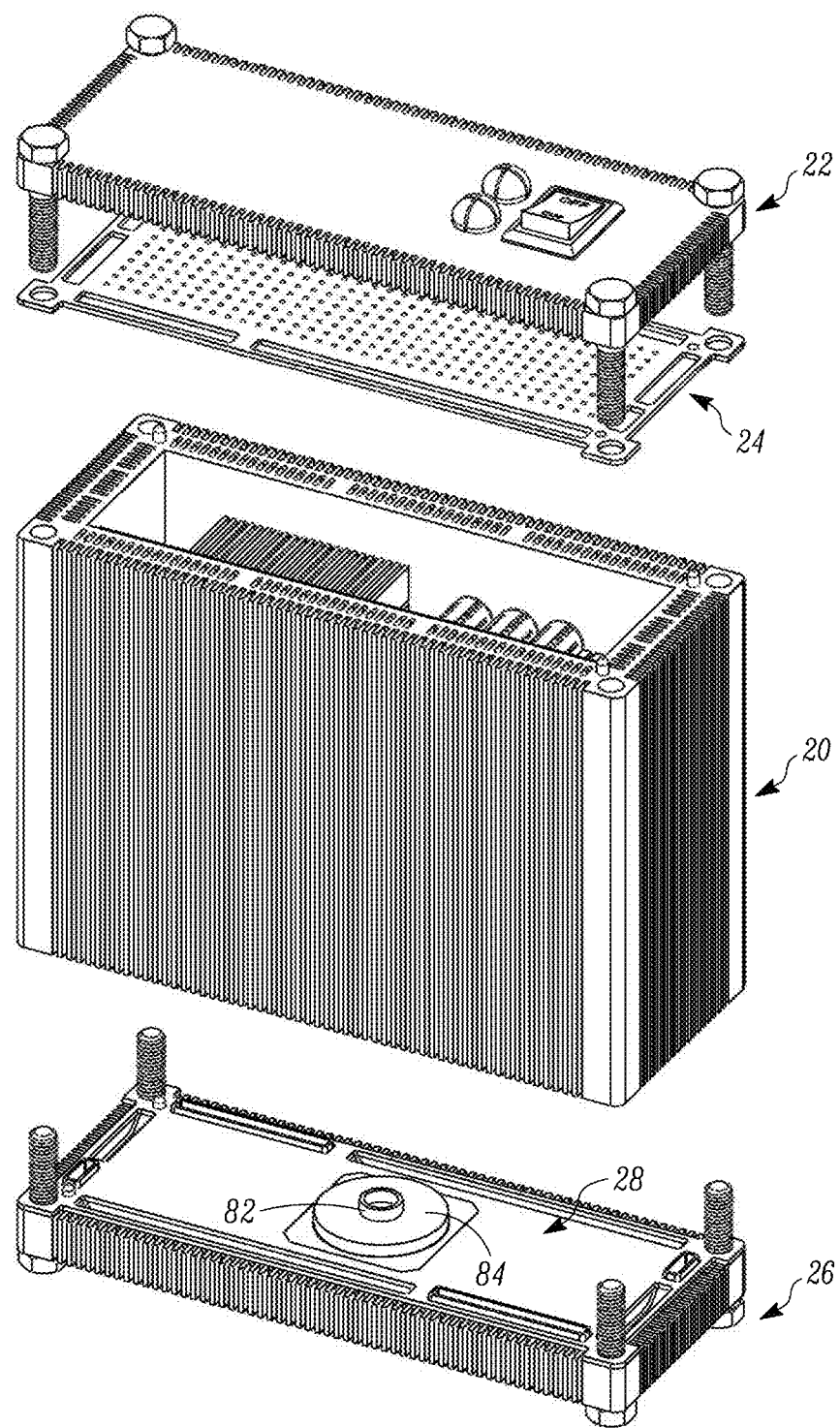
FIG. 4 is another exploded view of the electronic system of FIG. 1.

With reference to FIGS. 2-4, the end plates 22, 26 are each of generally rectangular construction matching the generally rectangular construction of the primary housing 20. The end plates 22, 26 are designed to be detachably fastened to the respective open ends 34, 36 of the primary housing 20 to close off the open ends 34, 36. Each end plate 22, 26 includes a base plate 60 and perimeter side walls 62*a*, 62*b*, 62*c*, 62*d* that extend from the base plate 60. The base plate 60 and the side walls 62*a-d* create a recessed area 64 on each end plate 22, 26.

The end plates 22, 26 can be detachably fastened to the primary housing 20 via any form of attachment technique. In the illustrated examples, mechanical fasteners 66 such as screws extend through holes in the end plates 22, 26 and into the holes 54 in the primary housing 20 to secure the end plates 22, 26 in position. The end plates 22, 26 can also include locator pin holes that correspond in position to the locator pin holes 56 in the primary housing 20. In one embodiment, the locator pins 68 can be positioned in the locator pin holes 56 of the primary housing 20 (for example as shown in FIG. 2) for fitting into the locator pin holes of the end plates 22, 26 when the end plates are attached the primary housing. In another embodiment, the locator pins 68 can be positioned in the locator pin holes of the end plates 22, 26 (for example, as shown in the end plate 26 in FIG. 2) for fitting into the locator pin holes 56 of the primary housing when the end plates are attached the primary housing. In another embodiment, the locator pins 68 can be positioned in the locator pin holes 56 of the primary housing 20 at one end, and positioned in the locator pin holes of the end plate at the opposite end, for fitting into the corresponding locator pins holes of the end plate and primary housing when the end plates are attached to the primary housing. Regardless of where the locator pins 68 are initially located, the locator pins 68 help properly position the end plates 22, 26 relative to the primary housing 20 and also help to properly position the sealing gaskets 24, 28 as discussed further below.

Figure 6:
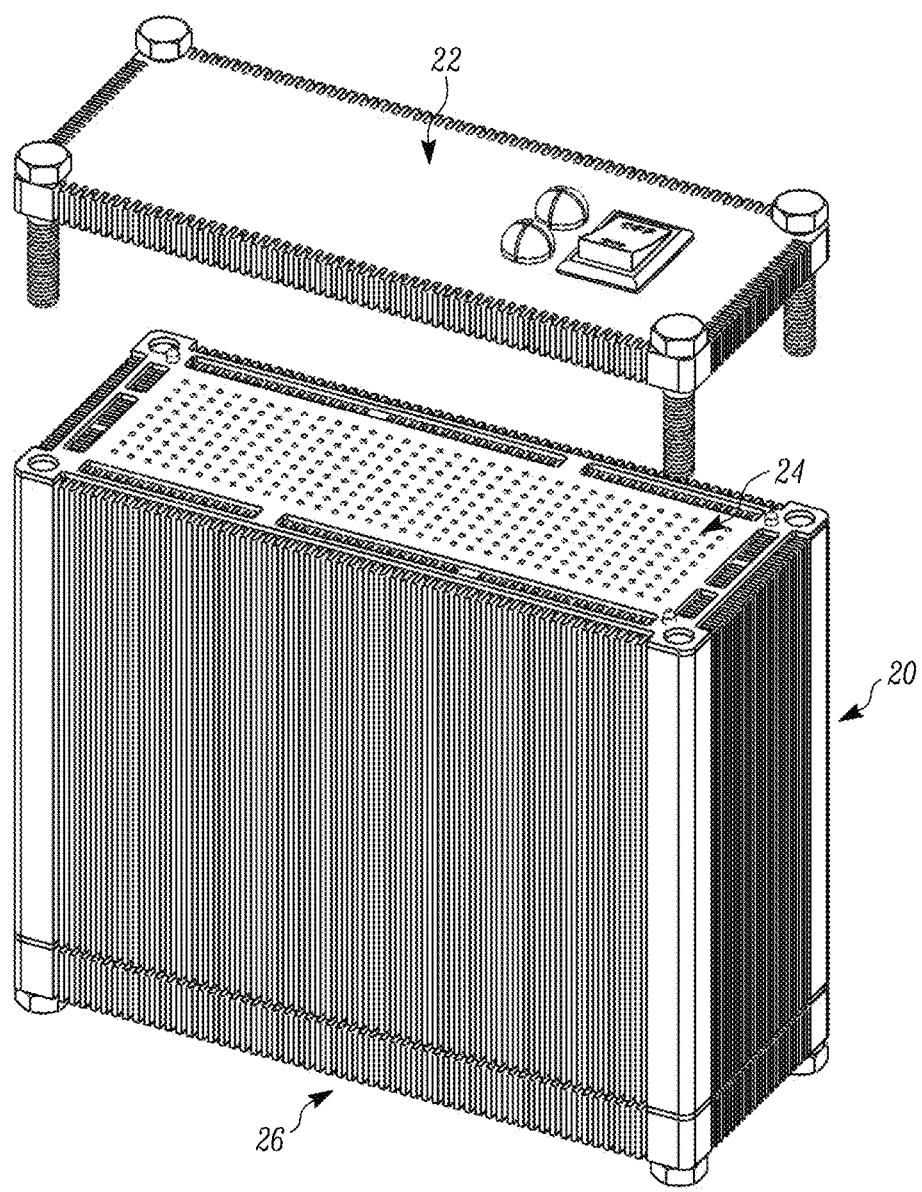
FIG. 6 illustrates how the sealing gasket at one end of the primary housing seats on the primary housing.
Figure 7:
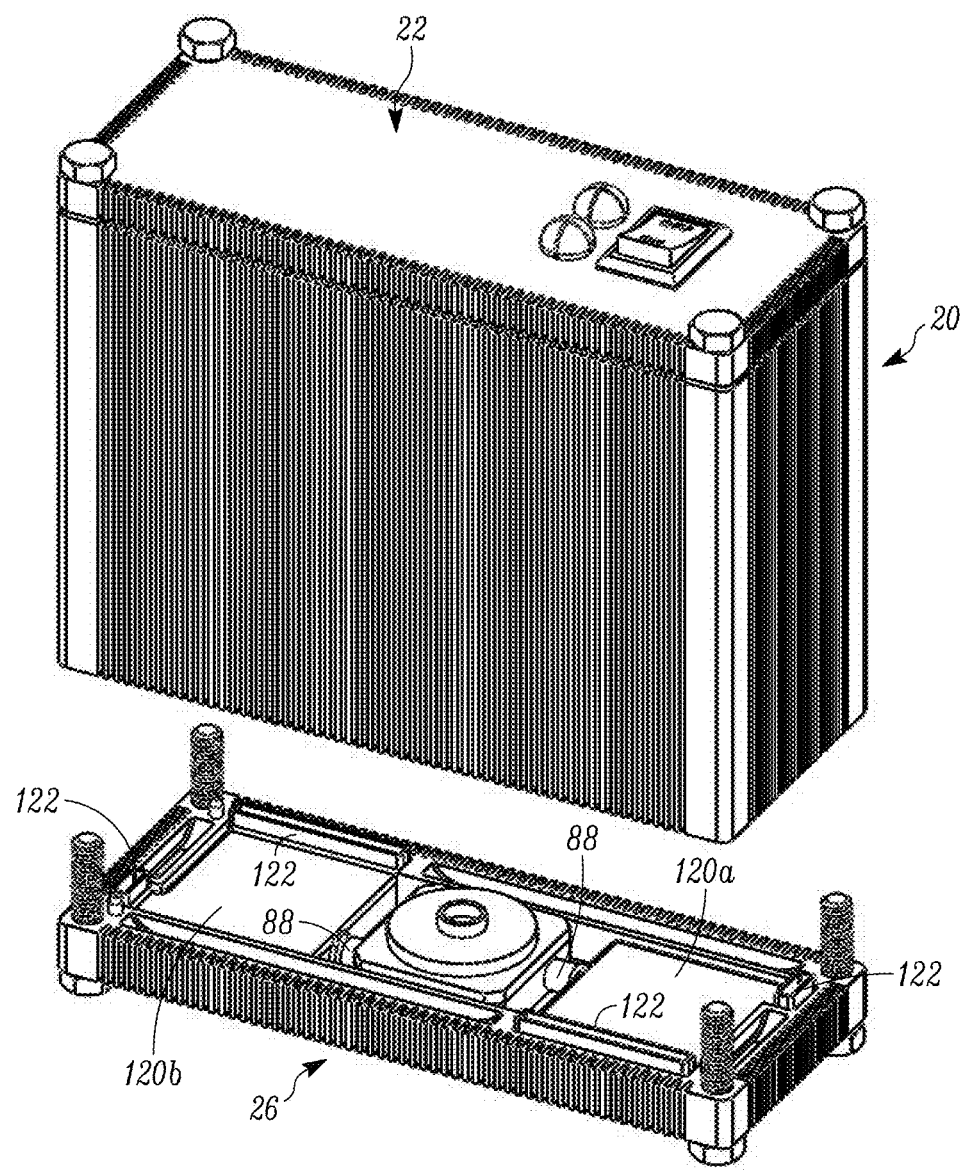
FIG. 7 illustrates another embodiment of the pump side end plate.

With continued reference to FIGS. 2-4, one or more of the side walls 62*a-d* of one or more of the end plates 22, 26 are formed with heat dissipation fins 70 on an exterior surface thereof. In the illustrated examples, each of the side walls 62*a-d* is provided with the fins 70. However, not all of the side walls 62*a-d* need to be provided with the fins 70. In one embodiment, the arrangement of the fins 70 on the side walls 62*a-d* correspond to the arrangement of the fins 50 on the corresponding walls 30*a-d* of the primary housing 20. In one embodiment, the number of the fins 70 on each of the side walls 62*a-d* corresponds with the number of the fins 50 on the corresponding wall 30*a-d*. In another embodiment, not only does the number of fins correspond, but the fins 70 can be substantially aligned with, and effectively form a continuation of, the fins 70 on the walls 30*a-d* as can be seen in FIGS. 6 and 7.

With reference to FIGS. 2 and 3, in one embodiment the recessed area 64 of the end plate 22 forms a return or input plenum for cooling liquid returning through the passages 52 after being cooled. Similarly, in another embodiment, the recessed area 64 of the end plate 26 forms an output plenum for cooling liquid after the liquid has exchanged heat with the electronic components and is to be circulated through the passages 52 for cooling.

The cooling liquid is circulated by a circulation system that includes a pump 80. The pump 80 pumps cooling liquid from the interior space 32 and into the recessed area 64 of the end plate 26. The cooling liquid is then directed by the circulation system from the recessed area 64 into some or all of the passages 52 at the open end 36 of the primary housing 20. The cooling liquid then flows through the passages 52 where the liquid is cooled, and then flows out of the passages 52 at the open end 34 and into the recessed area 64 of the end plate 22. The cooling liquid is then returned by the circulation system back into interior space 32 through the open end 34.

The pump 80 can be located at any position suitable for achieving its pumping functions. In one embodiment, the pump 80 can be mounted on the sealing gasket 28 and positioned in the recessed area 64 of the end plate 26 as illustrated in FIGS. 2-4 and 7-8. In this example, the pump 80 is mounted on one side of the gasket 28 and includes an inlet tube 82 and a circular enlargement 84 that is disposed within a circular opening 86 (see FIG. 9) in the gasket 28 in close fitting relationship therewith to mount the pump 80 on the gasket 28 and generally prevent fluid leakage between the enlargement 84 and the circular opening 86.

Referring to FIG. 3, the pump 80 includes at least one outlet 88 to direct the cooling liquid into the recessed area 64 of the end plate 26.

In another embodiment, the pump can be located in the interior space 32 of the primary housing 20. In another embodiment, the pump can be mounted on the gasket 24 and pumps the cooling liquid in a direction opposite to that described above. In another embodiment, the pump is not mounted on the gasket, but is instead mounted on one of the end plates 22, 26 and includes an input that extends through the sealing gasket. In still another embodiment, more than one pump is provided.

The pump(s) 80 can have any mechanical design known in the art that is suitable for pumping the cooling liquid, for example a centrifugal pump.

The sealing gaskets 24, 28 are configured to seal the joint between the end plates 22, 26 and the open ends 36, 36 of the primary housing and prevent leakage of cooling liquid from the enclosure. The sealing gaskets 24, 28 can also be configured to control the flow of cooling liquid within the enclosure 12. The gaskets 24, 28 can be formed of any material, such as rubber, silicone, metal, felt, Neoprene, fiberglass, or a plastic polymer such as polychlorotrifluoroethylene, or the like, that is suitable for performing the sealing and flow control functions.

With reference to FIGS. 2 and 3, the sealing gasket 24 comprises a generally planar, generally rectangular sheet with through holes 90 at the corners thereof through which the fasteners 66 extend. Additional through holes 92 are provided near the through holes 90 through which the locator pins 68 extend. At least one fluid opening 94 is formed through the gasket 24 along at least one edge thereof. The fluid opening 94 aligns with the outlets of the passages 52 at the open end 34 of the primary housing 20 to allow cooling liquid that has been cooled to flow out of the passages 52, through the gasket 24 and into the recessed area 64 of the end plate 22.

The number, size, and shape of the fluid opening 94 can be selected to control the flow of cooling liquid out of the passages 52. For example, as illustrated in FIGS. 2 and 3, the gasket 24 has two of the openings 94 along each edge of the gasket, with one of the openings 94a having a size to permit flow out of one of the groups or clusters 52a, 52b, 52c of passages in the primary housing, and one of the openings 94b having a larger size that permits flow out of two of the groups or clusters 52a, 52b, 52c of passages in the primary housing 20.

The sealing gasket 28 has a construction that is similar to the gasket 24. In particular, the gasket 28 can be a generally planar, generally rectangular sheet with through holes 100 at the corners thereof through which the fasteners 66 extend. Additional through holes 102 are provided near the through holes 100 through which the locator pins 68 extend. At least one fluid opening 104 is formed through the gasket 28 along at least one edge thereof. The fluid opening 104 aligns with the inlets of the passages 52 at the open end 36 of the primary housing 20 to allow cooling liquid to be cooled to flow from the recessed area 64 of the end plate 26, through the gasket 28, and in to the passages 52.

The number, size, and shape of the fluid opening 104 can be selected to control the flow of cooling liquid into the passages 52. For example, as illustrated in FIGS. 2 and 3, the gasket 28 has two of the openings 104 along each edge of the gasket, with one of the openings 104a having a size to permit flow into one of the groups or clusters 52a, 52b, 52c of passages in the primary housing, and one of the openings 104b having a larger size that permits flow into two of the groups or clusters 52a, 52b, 52c of passages in the primary housing 20.

Other numbers, sizes, and shapes of the fluid openings 94, 104 are possible. For example, as illustrated in FIG. 9, the gaskets 24, 28 can have single, large openings 94, 104 along each edge thereof that align with all of the passages 52.

Returning to FIG. 2, the sealing gasket 24 includes a central portion 106 that blocks the free flow of cooling liquid from the recessed area 64 back into the interior space 32 of the primary housing 20. However, the central portion 106 is provided with a plurality of holes 108. The holes 108 help to stratify the flow of the cooling liquid and create a uniform flow field as it flows back into the interior space 32. In addition, the holes 108 create discrete jets of cooling liquid therefrom which may impinge on one or more of the electronic components 42 to create an impingement cooling effect. The number of the holes 108, the location of the holes 108, the size of the holes 108, and/or the concentration of the holes 108 can each be tailored as desired to create the desired flow and cooling effects.

As shown in FIG. 2, the gasket 28 includes a central portion 110 that is solid and devoid of openings or holes. The solid central portion 110 fluidly separates the interior space 32 from the recessed area 64 of the end plate 26 so that the cooling liquid must flow through the pump 80 in order to reach the recessed area 64.

With reference to FIGS. 7 and 8, a modification of the end plate 26 is illustrated. In this embodiment, the outlets 88 of the pump 80 are fluidly connected to enclosed plenums 120a, 120b that fit within the recessed area of the end plate 26. All of the cooling liquid that flows through the pump 80 is directed into the plenums 120a, 120b. The plenums 120a, 120b are provided with one or more outlets 122, in the illustrated example two outlets 122. The outlets 122 correspond in shape and size to corresponding ones of the fluid openings 104a, 104b formed in the gasket 28 so that the outlets 122 fit into and through the fluid openings 104a, 104b as seen in FIG. 8. The outlets 122 help direct the flow of the cooling liquid into desired ones of the groups or clusters 52a, 52b, 52c of passages in the primary housing 20. The number of outlets 122 used, the positions of the outlets 122, and the size and/or shape of the outlets 122 can be changed as desired to alter the flow path of the cooling liquid and thereby tailor the cooling performance that is achieved.

In one embodiment, plenums similar to the plenums 120a, 120b can be used in the end plate 22 that would receive cooling liquid that is output from the passages 52. The plenums would include one or more outlets that extend through suitable openings provided in the central portion 106 of the gasket 24 to direct the return flow of cooling liquid directly onto certain ones of the electronic components to impingement cool the components.

Figure 11:
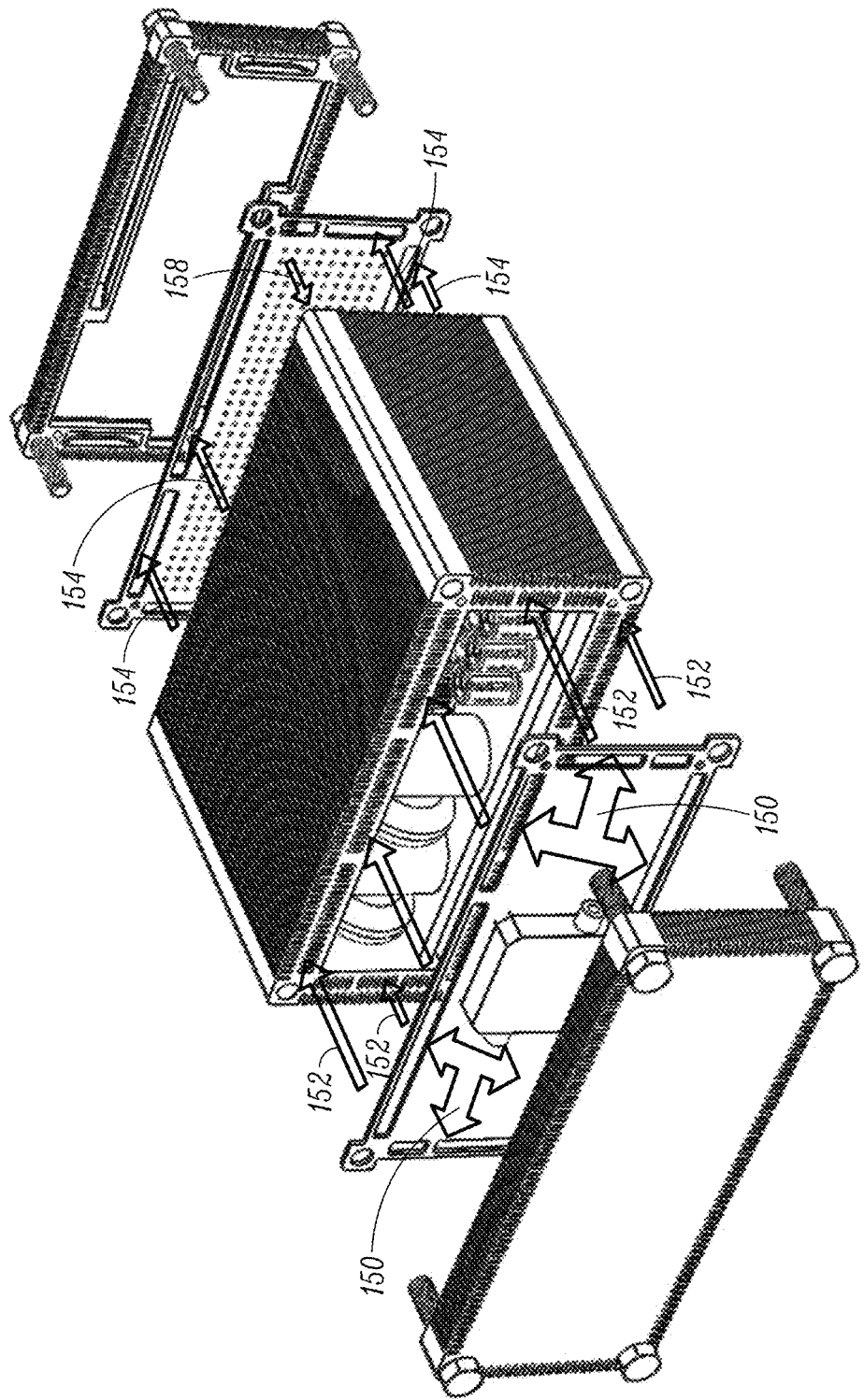
FIGS. 11 and 12 are similar to FIGS. 3 and 2, respectively, showing an embodiment of flow paths through the enclosure.
Figure 12:
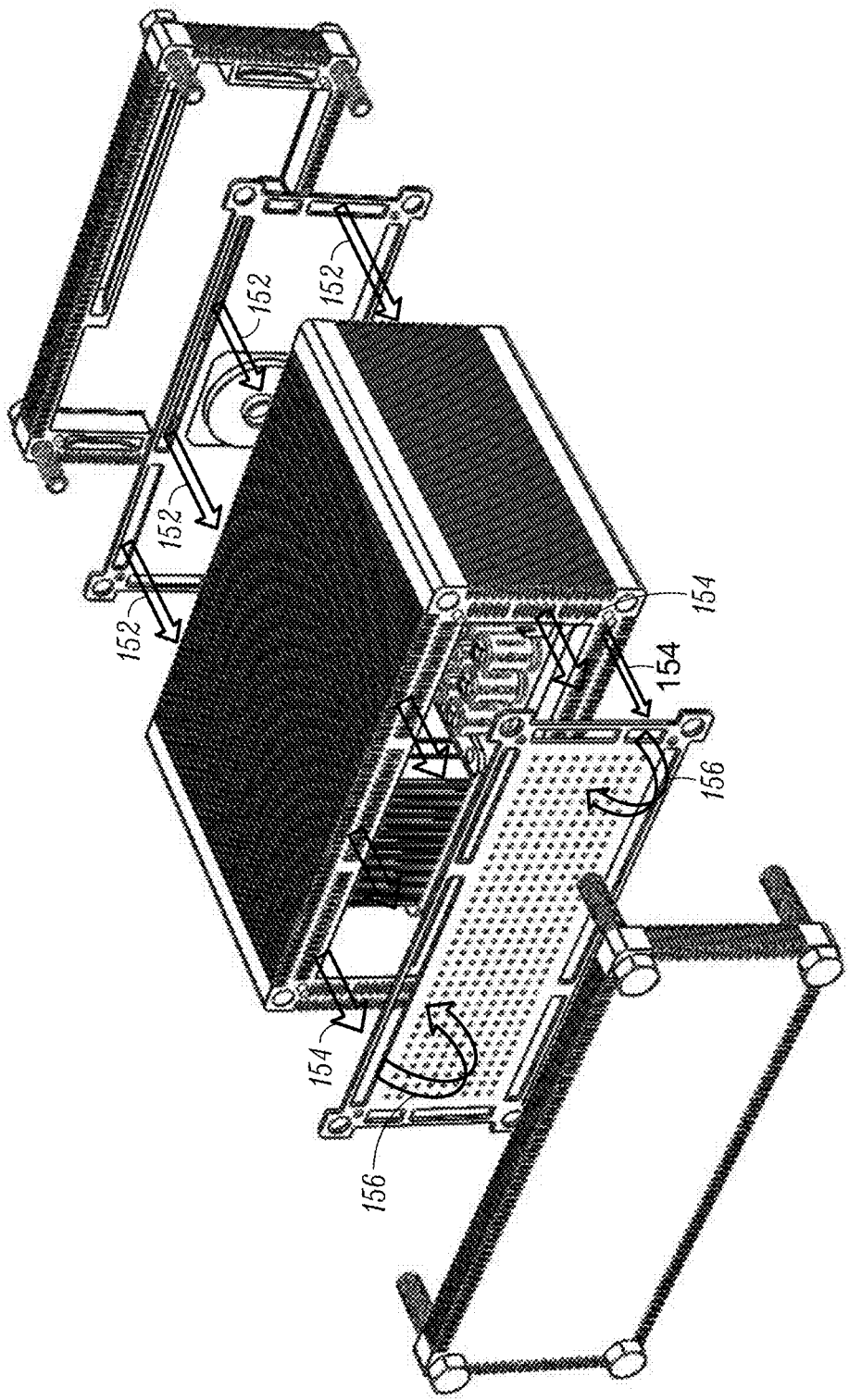

One example of a cooling operation in the electronic system 10 will now be described with reference to FIGS. 11 and 12, together with FIGS. 2-6. It is to be realized that other embodiments described herein operate in a similar manner. The enclosure 12 is initially assembled and filled with cooling liquid to a desired fill level sufficient to submerge the electronic components that one wishes to submersion cooling using the cooling liquid. To fill the enclosure 12, a suitable plugged fill port can be provided, for example on one of the end plates 22, 26 with the plug being removable from the fill port to permit filling with the cooling liquid. Alternatively, the enclosure 12 can be oriented vertically as shown in FIGS. 1 and 6, and the upper end plate 22 removed to permit filling of the interior space.

During operation of the electronic system 10, the electronic components thereof generate heat. Since the electronic components are submerged in the cooling liquid in direct contact therewith, the cooling liquid will absorb the generated heat. To remove the absorbed heat from the cooling liquid, the cooling liquid is circulated by the pump 80. In particular, the pump 80 draws in cooling liquid through its inlet 82 and outputs the liquid into the recessed area 64 of the end plate 26 as shown by the arrows 150 in FIG. 11. The end plate 26 will absorb some portion of the heat with the external fins 70 thereof helping to dissipate the absorbed heat to ambient. The cooling liquid then flows from the recessed area 64 through the fluid opening(s) 104 in the gasket 28 as shown by the arrows 152 in FIGS. 11 and 12 and into the fluid passages 52 formed in the wall(s) of the primary housing 20. The wall(s) of the primary housing 20 absorbs heat from the cooling liquid with the external fins 50 helping to dissipate the absorbed heat to ambient. The cooling liquid then exits out of the fluid passages 52 as shown by the arrows 154 in FIGS. 11 and 12, and then through the fluid opening(s) 94 in the gasket 24 and into the recessed area 64 in the end plate 22 as shown by the arrows 156. The end plate 22 will absorb some portion of the heat with the external fins 70 thereof helping to dissipate the absorbed heat to ambient. The now cooled cooling liquid then flows through the holes 108 in the central portion 106 of the gasket 24 back into the interior space 32 of the primary housing as shown by the arrows 156, 158 in FIGS. 11 and 12.

The pump 80 can run continuously whenever the electronic system 10 is operating. In another embodiment, the pump 80 can be controlled to operate periodically, for example being turned on at periodic time intervals and operating for a certain period of time. In still another embodiment, the pump 80 can be controlled intermittently, for example by being controlled based on the temperature of the cooling liquid and only being turned on when the cooling liquid reaches a predetermined temperature and being turned off when the cooling liquid has been cooled back down to a predetermined temperature.

Figure 13:
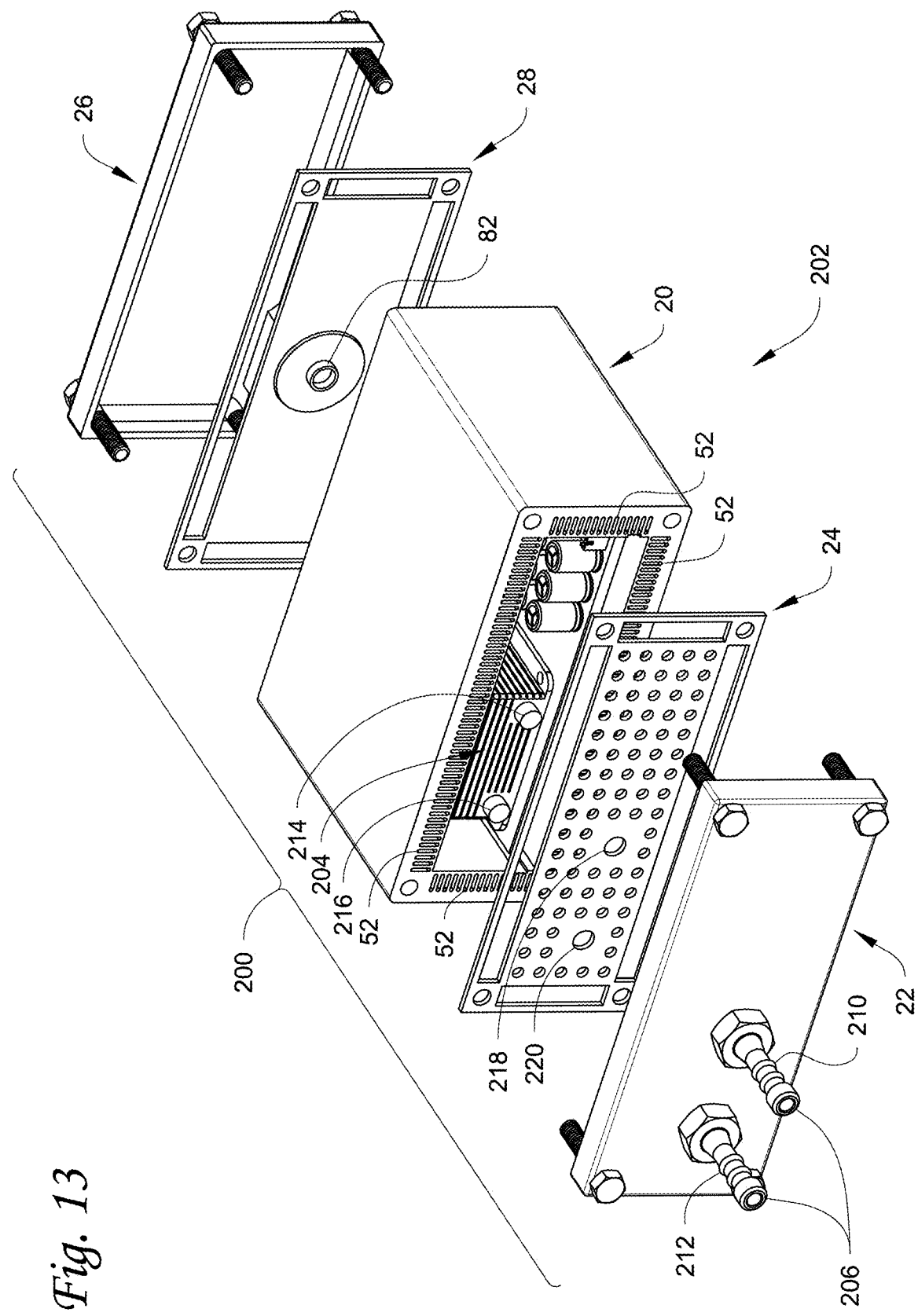
FIG. 13 is an exploded front perspective view of another embodiment of an enclosure of an electronic system described herein.
Figure 14:
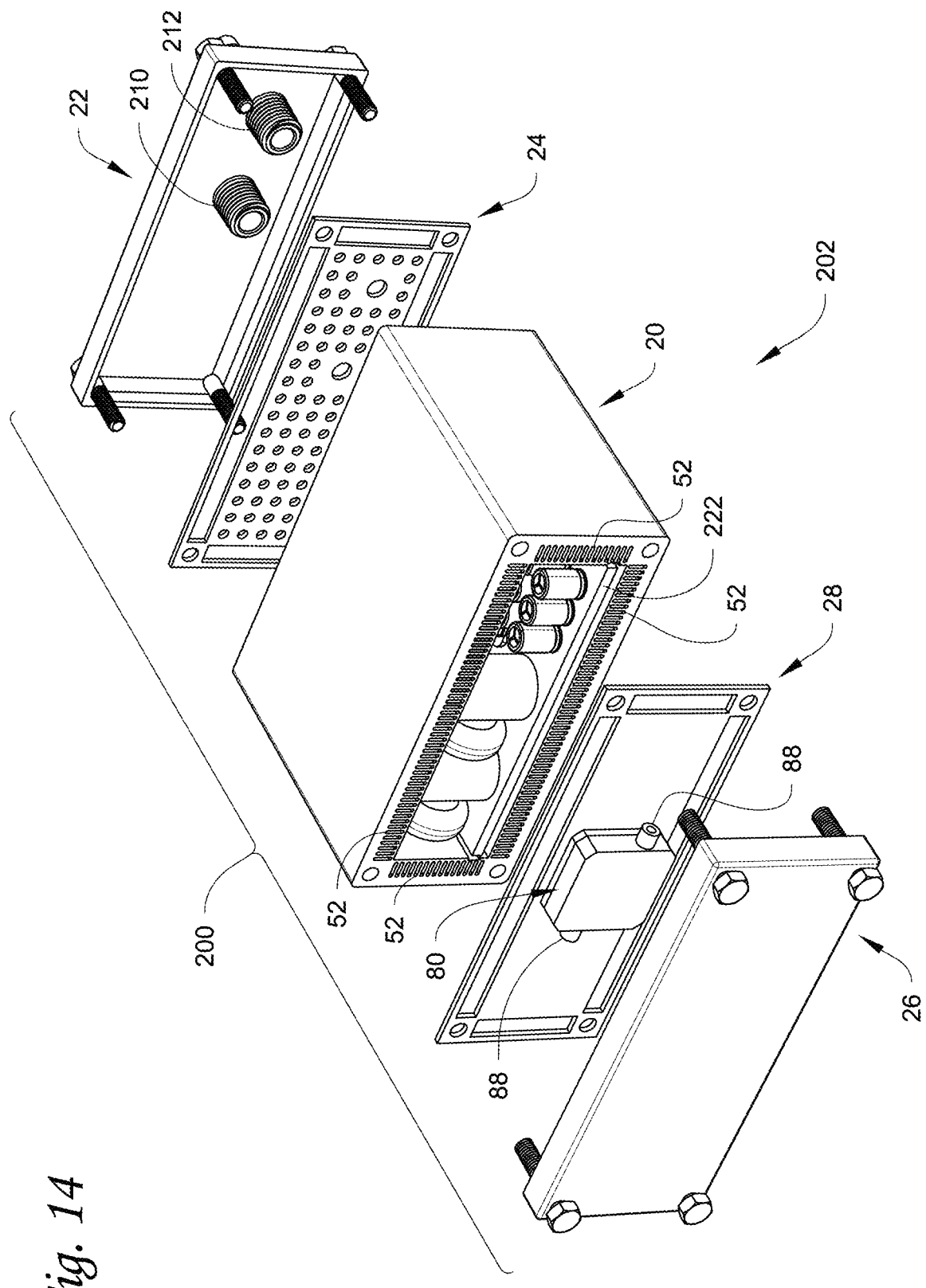
FIG. 14 is an exploded rear perspective view of the enclosure of FIG. 13.
Figure 15:
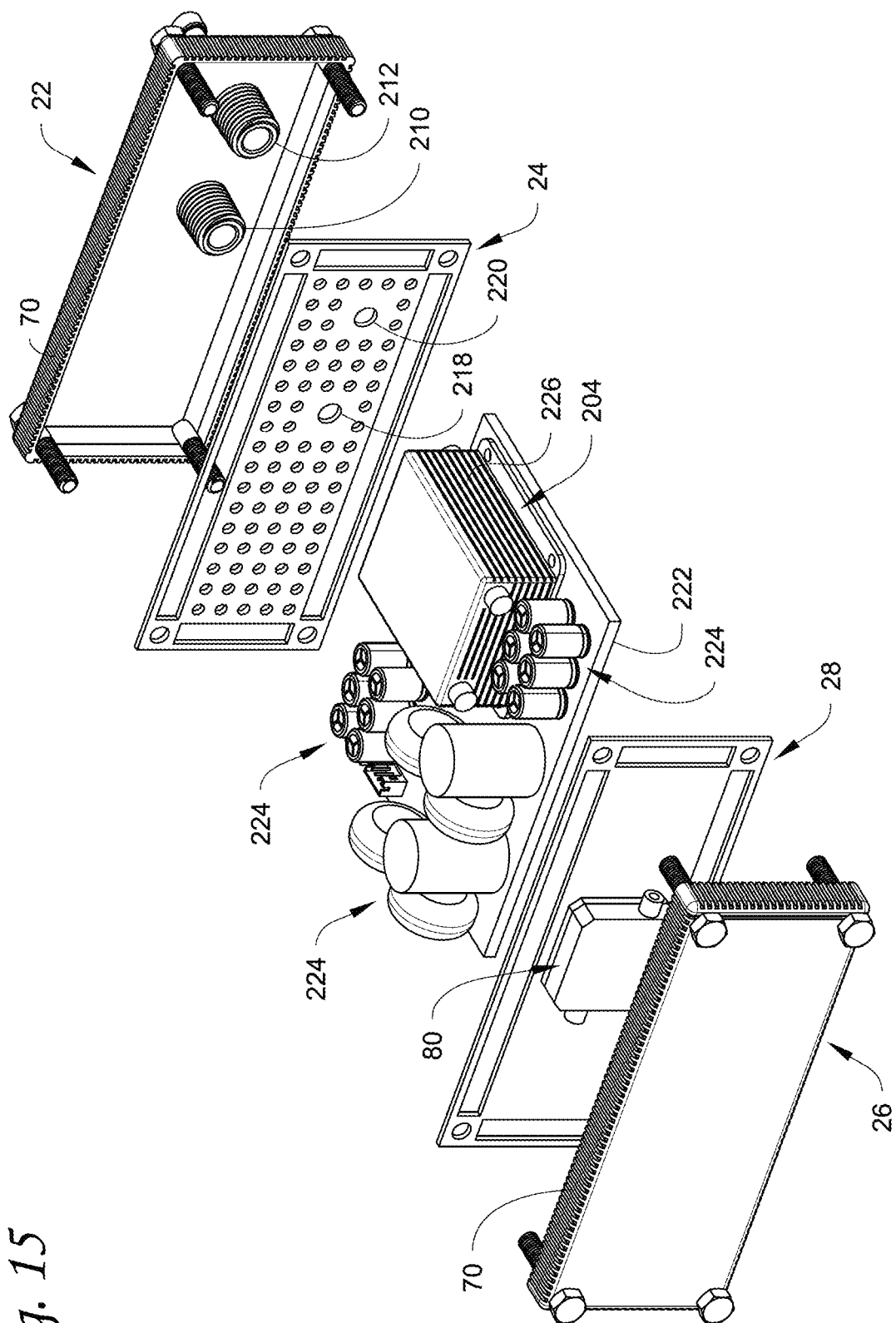
FIG. 15 is an exploded perspective view similar to FIG. 14 but with the primary housing removed to show internal electronic components and an internal heat sink.

Referring to FIGS. 13-15, another embodiment an enclosure 200 of an electronic system 202 is illustrated. In this embodiment, a heat exchanger 204 is located within the enclosure 200 within the interior bulk cooling liquid, with the heat exchanger 204 fluidly connected to an external secondary fluid loop 206 that optionally may have a remote pump and heat exchanger. This embodiment may be useful in situations where the power that needs to be dissipated exceeds the ability of the local environment to handle the heat exchange solely from the enclosure 200 for steady state operation. In this embodiment, both local heat exchange from the enclosure 200 and remote heat exchange via the secondary fluid loop 206 are utilized, with some heat being exchanged to the immediate surrounding of the enclosure 200 and some of the heat being transferred away from the local environment and being discharged elsewhere via the secondary fluid loop 206. In this embodiment, the secondary fluid loop 206 goes to the heat exchanger 204 within the enclosure 200, with fins on the heat exchanger 204 helping to augment the cooling by pulling additional heat out of the bulk cooling liquid. The bulk cooling liquid within the enclosure 200 is not forced through the heat exchanger 204.

Like the electronic systems described above, the electronic system 202 utilizes liquid submersion cooling of electronic components that are disposed within the enclosure 200. The enclosure 200 forms a liquid tight housing that houses the electronics components and the cooling liquid. The electronic components can be any electronic components forming any electronic system that would benefit from being liquid submersion cooled. The cooling liquid used to submerge the electronic components can be, but is not limited to, a dielectric liquid. The cooling liquid can be single phase or two-phase. In one embodiment, the cooling liquid has a high enough thermal transfer capability to handle the amount of heat being generated by the submerged electronic components so that the cooling liquid does not change state. Enough of the cooling liquid is present in the enclosure 200 in order to submerge the heat generating components that one wishes to submerge. So in some instances the cooling liquid may fill substantially the entire enclosure 200, while in other instances the cooling liquid may only partially fill the enclosure 200.

In FIGS. 13-15, parts that are similar or identical to parts in FIGS. 1-12 are referenced using the same reference numerals. The enclosure 200 includes the primary housing 20, then end plate 22 at one end, the sealing gasket 24 for sealing between the primary housing 20 and the end plate 22, the end plate 26 at the opposite end, and the sealing gasket 28 for sealing between the primary housing 20 and the end plate 26.

The construction, function and purpose of the primary housing 20 in FIGS. 13-15 is similar to the primary housing in FIGS. 1-12 in that the primary housing 20 includes the fluid passages 52 in the walls thereof to permit flow of the cooling liquid. The primary housing 20 is illustrated in FIGS. 13 and 14 as not including the fins on the exterior surfaces thereof. However, in some embodiments, the primary housing 20 in FIGS. 13 and 14 can include the fins 50 described above.

The construction, function and purpose of the end plates 22, 26 in FIGS. 13-15 are similar to the end plates 22, 26 in FIGS. 1-12. However, the end plates 22, 26 are illustrated as not including the fins on the exterior surfaces thereof. However, in some embodiments, the end plates 22, 26 can include the fins 70 described above as shown in FIG. 15. The end plates 22, 26 may also include any of the other features of the end plates 22, 26 described above in FIGS. 1-12.

The end plate 22 further includes a fluid inlet port 210 and a fluid outlet port 212 extending therethrough. The ports 210, 212 are part of the secondary fluid loop 206 for directing a secondary cooling fluid to and from the enclosure 200. The ports 201, 212 may be connected to a remote pump and heat exchanger that pumps and cools the secondary cooling fluid. In addition, the ports 210, 212 are fluidly connected to inlet and outlet ports 214, 216 of the heat exchanger 204 to direct the secondary cooling fluid into the heat exchanger 204.

The construction, function and purpose of the sealing gasket 24 in FIGS. 13-15 is similar to the sealing gasket 24 in FIGS. 1-12. However, the sealing gasket 24 further includes one or more passages, for example a pair of passages 218, 220, that permit the fluid connections, such as tubes, from the ports 210, 212 to extend through the sealing gasket 24 and connect to the ports 214, 216 of the heat exchanger 204.

The construction, function and purpose of the sealing gasket 28 in FIGS. 13-15 is similar to the sealing gasket 28 in FIGS. 1-12, including supporting the pump 80 with the inlet tube 82 and the at least one outlet 88.

Referring to FIGS. 13 and 15, the heat exchanger 204 is disposed within the interior of the enclosure 200, for example within the primary housing 20. The heat exchanger 204 is illustrated as being mounted on a board 222, such as a circuit board, along with heat generating electronic components 224. The heat generating electronic components 224 can include, but are not limited to, electronic computer components of a computing system, such as a server, including one or more processors, one or more power supplies, one or more switches, and other electronic computer components. The heat exchanger 204 is configured to exchange heat between the bulk cooling liquid within the primary housing 20 and the secondary cooling fluid circulated through the heat exchanger 204. To enhance heat transfer, the heat exchanger 204 can be a finned heat exchanger having a plurality of external fins 226 on the surface thereof to increase the surface area for heat transfer.

The system 202 in FIGS. 13-15 operates as follows. During operation of the electronic system 202, the electronic components thereof generate heat. Since the electronic components are submerged in the cooling liquid in direct contact therewith, the cooling liquid will absorb the generated heat. To remove some of the absorbed heat from the cooling liquid, the cooling liquid is circulated by the pump 80. In particular, the pump 80 draws in cooling liquid through its inlet 82 and outputs the liquid into the recessed area of the end plate 26. The end plate 26 will absorb some portion of the heat and will dissipate some of the heat to ambient. The cooling liquid then flows from the recessed area through the fluid opening(s) in the gasket 28 and into the fluid passages 52 formed in the wall(s) of the primary housing 20. The wall(s) of the primary housing 20 absorbs heat from the cooling liquid and will dissipate some of the absorbed heat to ambient. The cooling liquid then exits out of the fluid passages 52, and then through the fluid opening(s) in the gasket 24 and into the recessed area in the end plate 22. The end plate 22 will absorb some portion of the heat and will dissipate some of the absorbed heat to ambient. The now cooler cooling liquid then flows through the holes in the gasket 24 back into the interior space of the primary housing, some of which is returned directly onto the electronic components by the holes in the gasket 24. Additionally, the secondary cooling fluid is circulated through the heat exchanger 204 which is submerged in the bulk cooling liquid within the enclosure 200. The secondary cooling liquid draws heat away from the bulk cooling liquid. The heated secondary cooling fluid can then be output through the outlet port 212 to be suitably cooled, for example in a heat exchanger or other heat exchange mechanism, with the cooled secondary cooling fluid then being returned via the inlet port 210 to the heat exchanger 204.

Figure 16:
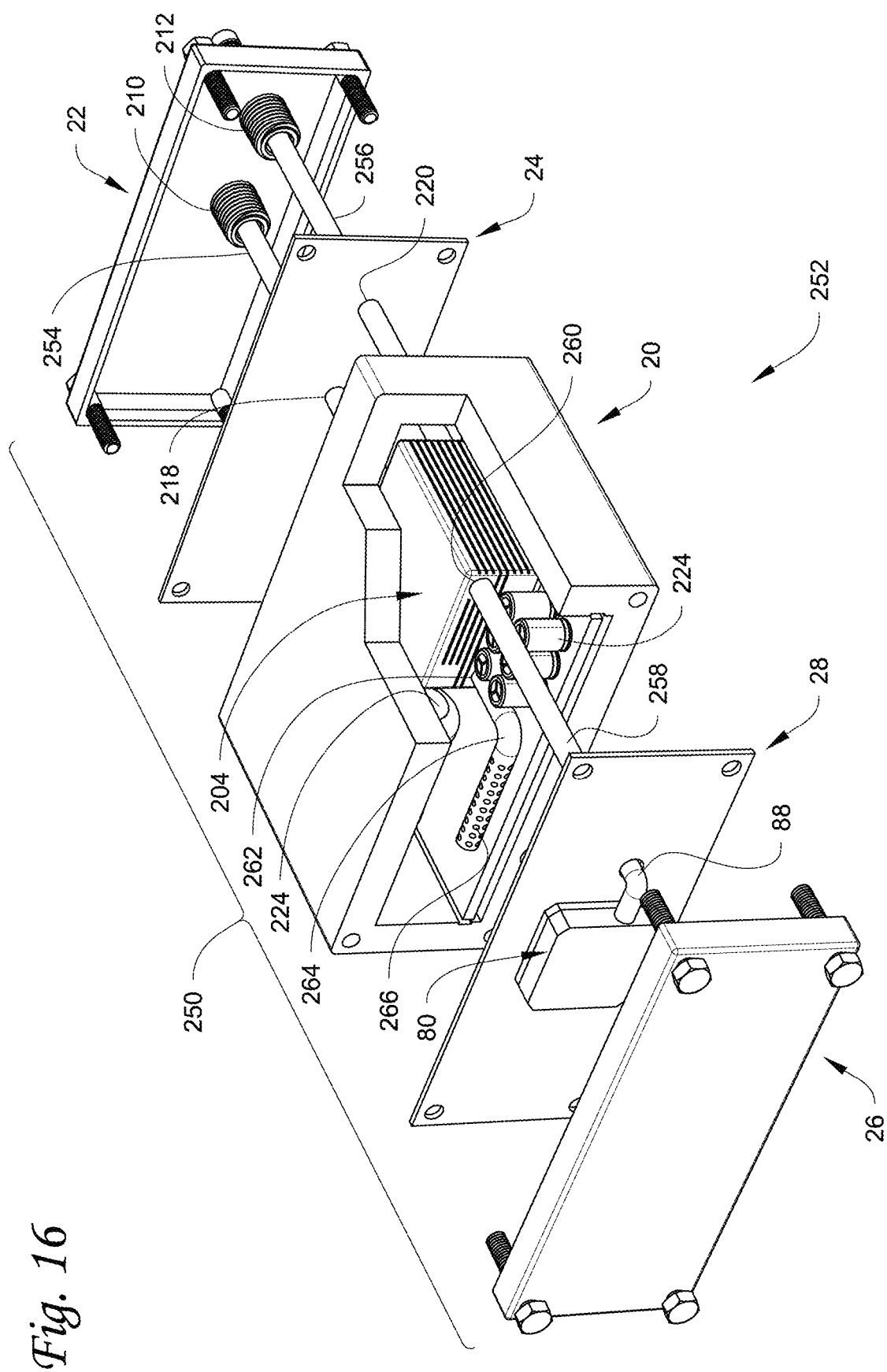
FIG. 16 is an exploded rear perspective view of another embodiment of an enclosure of an electronic system described herein.

Referring to FIG. 16, another embodiment an enclosure 250 of an electronic system 252 is illustrated. In FIG. 16, parts that are similar or identical to parts in FIGS. 1-15 are referenced using the same reference numerals. Like FIGS. 13-15, this embodiment includes the heat exchanger 204 located within the enclosure 250 within the interior bulk cooling liquid, with the heat exchanger 204 fluidly connected to the external secondary fluid loop 206 that optionally may have a remote pump and heat exchanger. In this embodiment, the majority of the heat exchange to cool the cooling liquid occurs via the heat exchanger 204, with the cooling liquid being circulated through the heat exchanger 204. However, there may be some heat exchange with the environment immediately surrounding the enclosure 250.

In this embodiment, the walls of the enclosure 250 do not include the fluid passages 52 because the cooling liquid is instead circulated through the heat exchanger 204. Accordingly, the sealing gaskets 24, 28 do not require the fluid openings 94, 104, 106. In addition, the enclosure 250 is illustrated as not including fins on either the primary housing 20 or on the end plates 22, 26. However, the enclosure 250 may include the fins 50 on the primary housing 20 and/or the fins 70 on the end plates 22, 26 if added heat transfer to the ambient environment from the enclosure 250 is desired.

Tubes 254, 256 extend from the ports 210, 212, through the passages 218, 220 in the sealing gasket 24, and to the ports 214, 216 (shown in FIG. 13) of the heat exchanger 204 to connect the secondary cooling fluid of the secondary fluid loop to the heat exchanger 204. In addition, the outlet 88 of the pump 80 is connected via a return tube 258 to a second inlet 260 of the heat exchanger 204 for directing the cooling liquid to be cooled into the heat exchanger 204. After being cooled, the cooling liquid is output through a second outlet 262 of the heat exchanger 204 for reintroduction back into the bulk cooling liquid within the primary housing 20. In this embodiment, a return tube 264 is illustrated as being connected to the second outlet 262. The return tube 264 includes a plurality of dispersion outlets 266 distributed about the circumference thereof and extending along a length of the tube 264. The dispersion outlets 266 direct the returning cooled cooling liquid into the bulk cooling liquid in the interior of the primary housing 20 as well as directing the returning cooled cooling liquid onto some of the electronic components 224 that are submerged in the bulk cooling liquid.

The system 252 in FIG. 16 operates as follows. During operation of the electronic system 252, the electronic components thereof generate heat. Since the electronic components are submerged in the cooling liquid in direct contact therewith, the cooling liquid will absorb the generated heat. The cooling liquid within the primary housing 20 is pumped via the pump 80 and into the heat exchanger 204. Additionally, the secondary cooling fluid is circulated through the heat exchanger 204 which is submerged in the bulk cooling liquid within the enclosure 250. The secondary cooling liquid exchanges heat with the cooling liquid circulating through the heat exchanger 204. The heated secondary cooling fluid can then be output through the outlet port 212 to be suitably cooled, for example in a heat exchanger or other heat exchange mechanism, with the cooled secondary cooling fluid then being returned via the inlet port 210 to the heat exchanger 204. The cooled cooling liquid is then output from the heat exchanger 204 via the return tube 264, with the cooling liquid being reintroduced back into the bulk cooling liquid in the primary housing 20 and with some of the cooling liquid exiting the dispersion outlets 266 and being directed onto the electronic components 224 submerged in the bulk cooling liquid. In addition to the heat exchange via the heat exchanger 204, some heat exchange may occur via the enclosure 250 dissipating some heat to the surrounding ambient environment.

FIG. 17 illustrates an embodiment that is similar to the embodiment in FIG. 16, and parts that are similar or identical to parts in FIGS. 1-16 are referenced using the same reference numerals. In this embodiment, the return tube 264 differs from the return tube 264 in FIG. 16. In particular, rather than using the dispersion outlets 266, the return tube 264 in FIG. 17 includes one or more directed outlets 268 that provide a more focused or directed flow of the returning cooled cooling liquid onto the desired electronic components 224 that are submerged in the bulk cooling liquid in the primary housing 20.

In some embodiments, the cooling liquid does not need to be circulated. Instead, the heat absorption capacity of the cooling liquid can be sufficient to absorb sufficient heat, with the heat then being dissipated from the cooling liquid via contact of the cooling liquid with the walls of the enclosure 12 and/or the end plates 22, 26 which direct the heat through the walls and to the external fins where the heat is dissipated to ambient air.

The concepts described may be embodied in other forms without departing from the spirit or novel characteristics thereof. The examples disclosed in this application are to be considered in all respects as illustrative and not limitative.

The invention claimed is:
1. A method of cooling a heat generating electronic computer component of a computing system, comprising:
  submerging the heat generating electronic computer component, that is mounted on an upper surface of a circuit board, of the computing system in a single-phase dielectric cooling liquid contained in an interior space defined within an enclosure of the computing system so that the heat generating electronic computer component is in direct contact with the single-phase dielectric cooling liquid; the enclosure includes a first wall and a second wall opposite the first wall that are parallel to the circuit board, a first side wall, a second side wall, a first end wall and a second end wall;
  after contacting the heat generating electronic computer component, circulating the single-phase dielectric cooling liquid through a heat exchanger to cool the single-phase dielectric cooling liquid without circulating the single-phase dielectric cooling liquid to an external heat exchanger, wherein the single-phase dielectric cooling liquid is circulated by a pump disposed within the interior space of the enclosure and disposed within the single-phase dielectric cooling liquid and the pump is not mounted on the circuit board; and directing a return flow of the single-phase dielectric cooling liquid, after being cooled in the heat exchanger, into a manifold within the enclosure that does not overlap the upper surface and that is not affixed to the circuit board, and thereafter from the manifold directly onto the submerged heat generating electronic computer component or directly onto a heat sink that is fixed to the submerged heat generating electronic computer component.

2. A liquid submersion cooled computer, comprising:

a sealed, liquid-tight enclosure defining an interior space;

a circuit board disposed in the interior space, an upper surface of the circuit board being parallel to a bottom wall and a top wall of the sealed, liquid-tight enclosure;

a heat generating electronic computer component disposed on the upper surface of the circuit board;

a single-phase dielectric cooling liquid within the interior space and submerging the heat generating electronic computer component in direct contact therewith;

a pump within the interior space and disposed within the single-phase dielectric cooling liquid, the pump having an inlet in communication with the single-phase dielectric cooling liquid, and an outlet, the pump is not mounted on the circuit board;

a heat exchanger that is not external to the sealed, liquid-tight enclosure, the heat exchanger is configured to receive warm single-phase dielectric cooling liquid, and the heat exchanger is configured to cool the warm single-phase dielectric cooling liquid;

the heat exchanger having an outlet through which cooled single-phase dielectric cooling liquid is output; and a manifold within the sealed, liquid-tight enclosure and not overlapping the upper surface of and not affixed to the circuit board, the manifold is in fluid communication with the outlet of the heat exchanger to receive the cooled single-phase dielectric cooling liquid therefrom, the manifold includes a plurality of outlets with at least one of the outlets directing a returning flow of the cooled single-phase dielectric cooling liquid onto the submerged heat generating electronic computer component or directly onto a heat sink that is fixed to the submerged heat generating electronic computer component.

3. The liquid submersion cooled computer of claim 2, wherein the submerged heat generating electronic computer component comprises a processor.

4. The liquid submersion cooled computer of claim 2, comprising an additional pump within the interior space, the additional pump having an inlet in communication with the single-phase dielectric cooling liquid, and an outlet.

5. A system, comprising:

a rack having a plurality of vertical levels; and a liquid submersion cooled computer of claim 2 on each of the vertical levels of the rack.

* * * * *